US012751057B2

(12) United States Patent
Lin et al.

(10) Patent No.: US 12,751,057 B2
(45) Date of Patent: Sep. 29, 2026

(54) TRANSISTOR STRUCTURE WITH GATE ISOLATION STRUCTURES AND METHOD OF FABRICATING THEREOF

(71) Applicant: Taiwan Semiconductor Manufacturing Company, Ltd., Hsinchu (TW)

(72) Inventors: Ta-Chun Lin, Hsinchu (TW); Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 642 days.

(21) Appl. No.: 18/167,169

(22) Filed: Feb. 10, 2023

(65) Prior Publication Data

US 2024/0120377 A1 Apr. 11, 2024

Related U.S. Application Data

(60) Provisional application No. 63/378,955, filed on Oct. 10, 2022.

(51) Int. Cl.
*H10D 30/43* (2025.01)
*H10D 30/01* (2025.01)
(Continued)

(52) U.S. Cl.
CPC ......... *H10D 62/121* (2025.01); *H10D 30/014* (2025.01); *H10D 30/43* (2025.01); *H10D 30/6757* (2025.01); *H10D 84/0128* (2025.01); *H10D 84/0151* (2025.01); *H10D 84/0158* (2025.01); *H10D 84/038* (2025.01)

(58) Field of Classification Search
CPC .... H10D 62/121; H10D 30/014; H10D 30/43; H10D 30/6757; H10D 84/0128; H10D 84/0151; H10D 84/0158; H10D 84/038; H10D 30/6735; H10D 62/364; H10D 84/83
See application file for complete search history.

(56) References Cited

U.S. PATENT DOCUMENTS

| | | | |
|---|---|---|---|
| 8,815,691 | B2 | 8/2014 | Colinge |
| 10,032,627 | B2 | 7/2018 | Lee |

(Continued)

FOREIGN PATENT DOCUMENTS

| | | | |
|---|---|---|---|
| TW | 202205389 | A | 2/2022 |
| TW | 202234525 | A | 9/2022 |

(Continued)

*Primary Examiner* — Marlon T Fletcher
*Assistant Examiner* — Da Wei Lee
(74) *Attorney, Agent, or Firm* — Haynes and Boone, LLP

(57) ABSTRACT

Semiconductor structures and processes are provided that include a first gate isolation structure and a second gate isolation structure. The first gate isolation structure may be formed on a dielectric wall from which nanostructure channel regions extend. The second gate isolation structure may be formed on a shallow trench isolation feature. The height of the first gate isolation structure is less than the height of the second gate isolation structure. The composition of the first gate isolation structure may be different than the composition of the second gate isolation structure. In some implementations, the first gate isolation structure is formed concurrently with gate spacers.

12 Claims, 26 Drawing Sheets

(51) Int. Cl.

| | |
|---|---|
| ***H10D 30/67*** | (2025.01) |
| ***H10D 62/10*** | (2025.01) |
| ***H10D 84/01*** | (2025.01) |
| ***H10D 84/03*** | (2025.01) |

(56) References Cited

U.S. PATENT DOCUMENTS

| | | | | |
|---|---|---|---|---|
| 10,629,501 | B2 | 4/2020 | Doornbos | |
| 10,861,952 | B2 | 12/2020 | Ching | |
| 10,879,246 | B2 | 12/2020 | Cheng | |
| 11,164,942 | B1 * | 11/2021 | Weckx | H10D 62/121 |
| 2019/0148539 | A1 * | 5/2019 | Yang | H10D 30/62 257/401 |
| 2020/0135575 | A1 * | 4/2020 | Greene | H10D 84/038 |
| 2021/0083091 | A1 * | 3/2021 | Peng | H10D 30/62 |
| 2021/0313181 | A1 * | 10/2021 | Chen | H10D 64/01326 |

FOREIGN PATENT DOCUMENTS

| | | | |
|---|---|---|---|
| TW | 202236437 | A | 9/2022 |
| TW | 202238741 | A | 10/2022 |

* cited by examiner

TRANSISTOR STRUCTURE WITH GATE ISOLATION STRUCTURES AND METHOD OF FABRICATING THEREOF

CROSS-REFERENCE TO RELATED APPLICATIONS

This application claims priority to U.S. Prov. App. Ser. No. 63/378,955, filed Oct. 10, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and or gate-all-around (GAA) (e.g., multi-bridge-channel (MBC)) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An GAA transistor has a gate structure that can extend, partially or fully, around a channel region to provide access to the channel region on two or more sides. Because its gate structure surrounds the channel regions, an MBC transistor may also be referred to as a surrounding gate transistor (SGT) or GAA transistor.

Because of the shrinking technology nodes, processing challenges can arise in providing suitable isolation between features of a transistor or adjacent transistors. Providing suitable isolation in an efficient and effective manner is desired for benefits in device performance and costs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 14A-16D illustrate fragmentary top views or cross-sectional views of a device during various fabrication stages in the method of FIG. 1 have an alternative implementation of block 110 of the method, according to one or more aspects of the present disclosure.

FIGS. 17A-20D illustrate fragmentary top views or cross-sectional views of a device during various fabrication stages in the method of FIG. 1 have another embodiment of the method, according to one or more aspects of the present disclosure.

DETAILED DESCRIPTION

Figure 1:
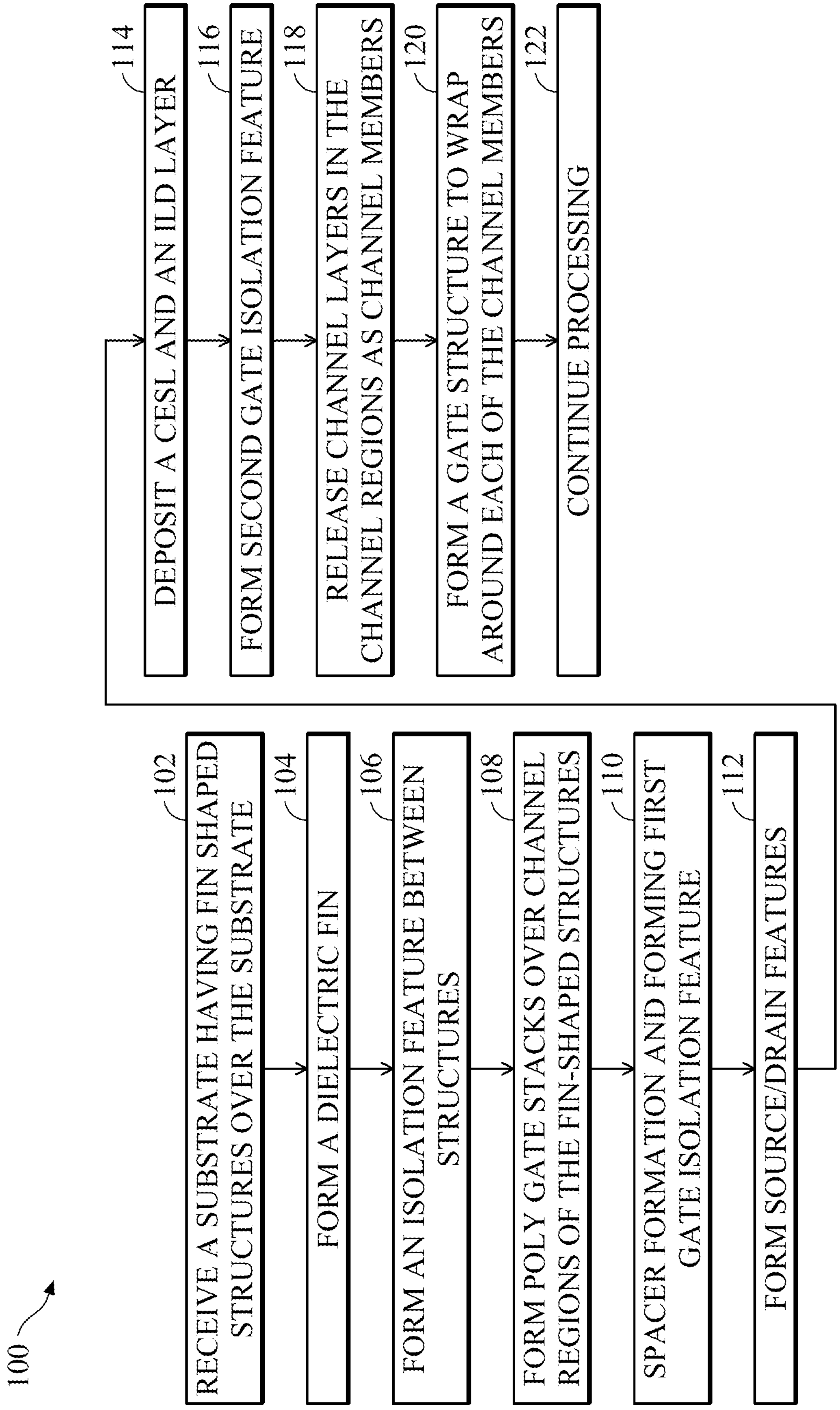
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be+/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

To improve drive current to meet design needs, MBC transistors may include nanoscale channel members or nanostructures that are thin and wide. Such MBC transistors may also be referred to as nanosheet transistors. While nanosheet transistors are able to provide satisfactory drive current and channel control, their wider nanosheet channel members may make it challenging to reduce cell sizes. Variants of MBC transistors, such as those referred to as fish-bone structures or forksheet structures, have been proposed to reduce cell dimensions. In a forksheet structure, adjacent stacks of channel members may be divided by a dielectric wall (also referred to as a dielectric fin). The dielectric wall usually has a height substantially equal to or greater than that of the topmost channel members or that of the source/drain features. The transistors also typically have isolation features between segments of a gate structure, which are referred to as gate isolation structures or also as gate-cut structures.

The present disclosure provides a semiconductor structure where a gate isolation structure or gate-cut structure is formed between gate segments (e.g., portions of a gate line). The present disclosure provides a semiconductor structure with two types of gate-cut structures. One type of gate-cut structure extends between gate segments to a dielectric wall or dielectric fin. A second type of gate-cut structure extends between gate segments to an isolation feature such as a shallow trench isolation (STI) extending between active regions (e.g., fins). Each of these gate-cut structures may be fabricated on a single device. However, the gate-cut structures may differ in depth (e.g., height of the formed structure) as one type lands on a dielectric wall and the other lands on an isolation structure such as STI, which is lower than the dielectric wall. Therefore, forming these disparate structures can raise difficulties in processing and/or increased costs.

The various aspects of the present disclosure will now be described in more detail with reference to the figures. FIG. 1 illustrates a flowchart of a method 100 of forming a semiconductor structure, also referred to as a semiconductor device. Method 100 is merely an example and is not intended to limit the present disclosure. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2A-12E, which illustrate fragmentary cross-sectional views of a device 200 at different stages of fabrication according to embodiments of method 100. The X direction, the Y direction, and the Z direction in the figures are perpendicular to one another and are used consistently. Additionally, throughout the present disclosure, like reference numerals are used to denote like features. FIGS. 13A-23C illustrate exemplary embodiments that may also be fabricated using the method 100 and may be substantially similar to the device 200 in some respects, but with differences as discussed below.

FIGS. 2A, 3A, 4A, 5A, 6A, 6F, 7A, 7E, 8A, 9A, 10A, 11A, 12A, 13A, 13B, 14A, 15A, 16A, 17A, 18A, 19A, 20A, 21A, 22A, and 23A illustrate top views of the corresponding device. FIGS. 6A, 7A, 8A, 9A, 10A, 11A, 12A, 13A, 13B, 14A, 15A, 16A, 17A, 18A, 19A, 20A, 21A, and 22A include two top views of the corresponding device, a first view provides a top view taken at plane drawn below a top of an active region, this is illustrated as the corresponding Y1 cut in the cross-sectional view of the corresponding FIGS. 6B, 7B, 8B, 9B, 10B, 11B, 12B, 14B, 15B, 16B, 17B, 18B, 19B, 20B, 21B, and 22B. A second view provides a top view taken at plane drawn above a dielectric wall between the active regions, this is illustrated as the corresponding Y2 cut in the cross-sectional view of the corresponding FIGS. 6B, 7B, 8B, 9B, 10B, 11B, 12B, 14B, 15B, 16B, 17B, 18B, 19B, 20B, 21B, and 22B.

FIGS. 2B, 3B, 4B, 5B, 6B, 7B, 8B, 9B, 10B, 11B, 12B, 14B, 15B, 16B, 17B, 18B, 19B, 20B, 21B, 22B, and 23B illustrate a cross-sectional view of a corresponding device where the cross-sectional cut is taken in the Y direction along a gate structure. FIGS. 2C, 3C, 4C, 5C, 6C, 7C, 8C, 9C, 10C, 11C, 12C, 14C, 15C, 16C, 17C, 18C, 19C, 20C, 21C, and 22C illustrate a cross-sectional view of a corresponding device where the cross-sectional cut is taken in the X direction along the isolation region (STI) between active regions. This is illustrated in the top view as cut X2. FIGS. 2D, 3D, 4D, 5D, 6D, 7D, 8D, 11D, 12D, 14D, 15D, 16D, 17D, 18D, 19D, 20D, and 23C illustrate a cross-sectional view of a corresponding device where the cross-sectional cut is taken in the X direction along the active regions. This is illustrated in the top view as cut X1. FIGS. 6E and 12E illustrate a layout corresponding to the illustrated device.

Referring to FIGS. 1 and 2A, 2B, 2C, and 2D, method 100 includes a block 102 where a structure having fin-shaped active region structures over a substrate. As shown in FIGS. 2A, 2B, 2C, and 2D, a device 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlinAs), aluminum gallium arsenide (AlGaAs), gallium indium phosphide (GaInP), and indium gallium arsenide (InGaAs). The substrate 202 may include multiple n-type well regions and multiple p-type well regions. A p-type well region may be doped with a p-type dopant (i.e., boron (B)). An n-type well region may be doped with an n-type dopant (i.e., phosphorus (P) or arsenic (As)).

Figure 2A:
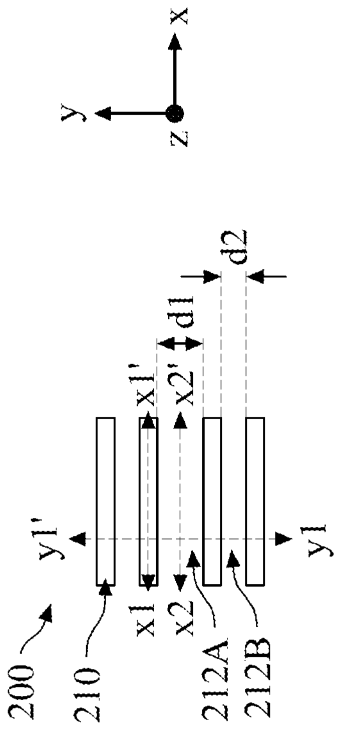
FIGS. 2A-12D illustrate fragmentary top views or cross-sectional views of a device during various fabrication stages in the method of FIG. 1, according to one or more aspects of the present disclosure.
Figure 2B:
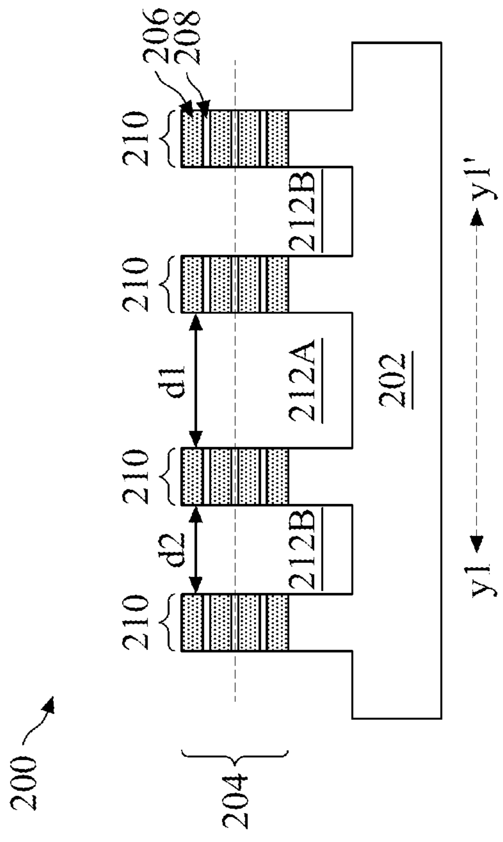
Figure 2C:
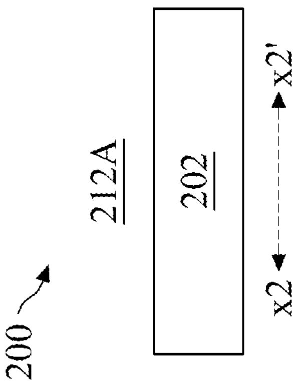
Figure 2D:
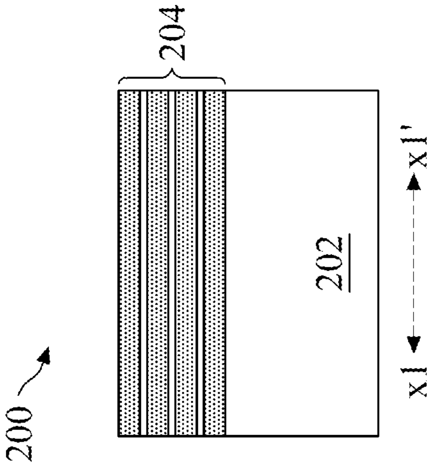
Figure 3A:
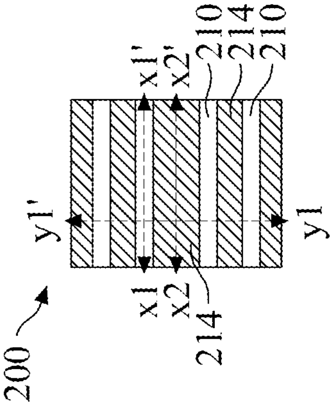
Figure 3B:
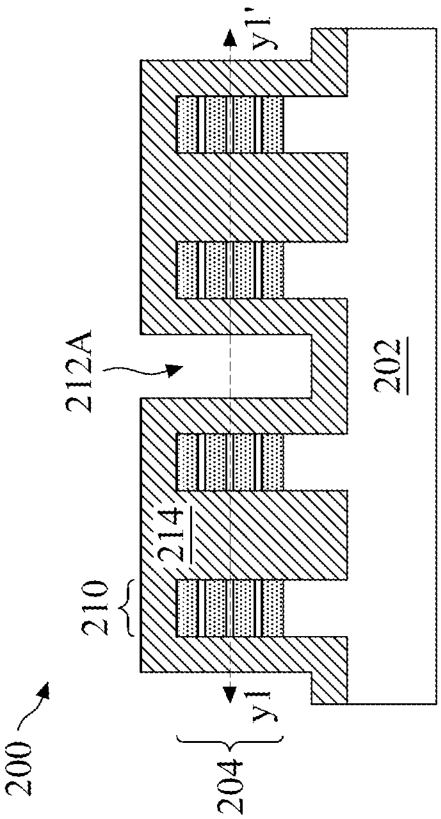
Figure 3C:
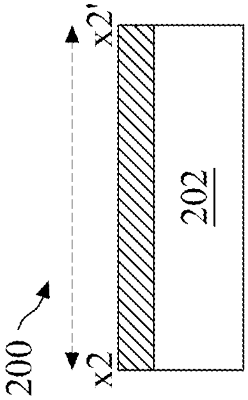
Figure 3D:
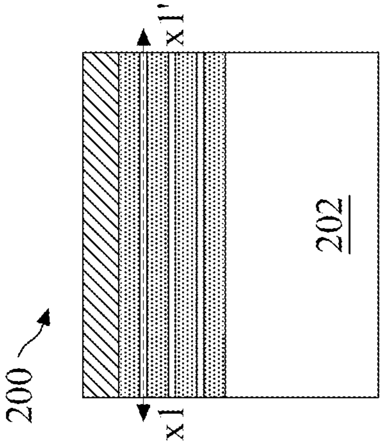
Figure 4A:
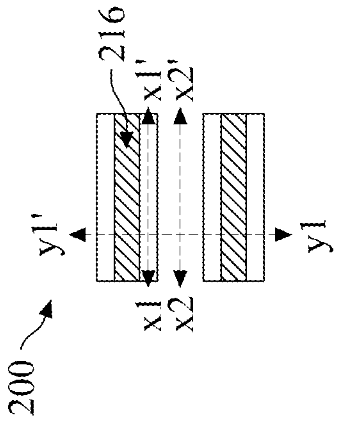
Figure 4B:
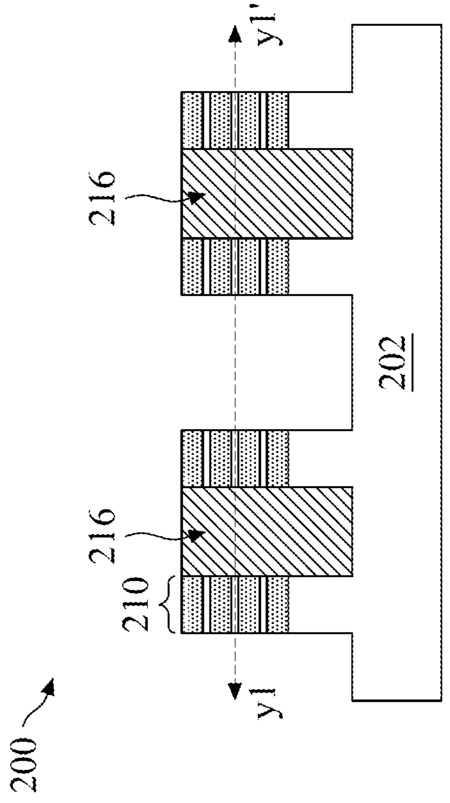
Figure 4C:
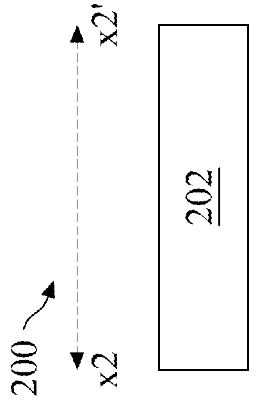
Figure 4D:
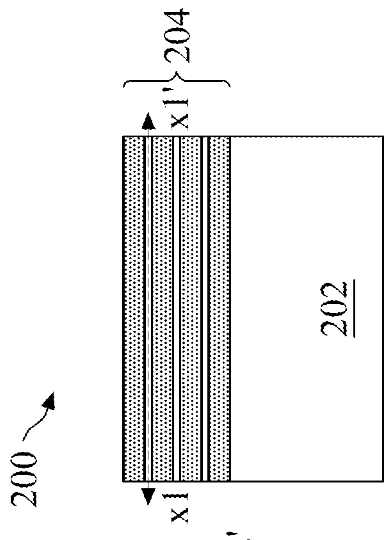
Figure 5A:
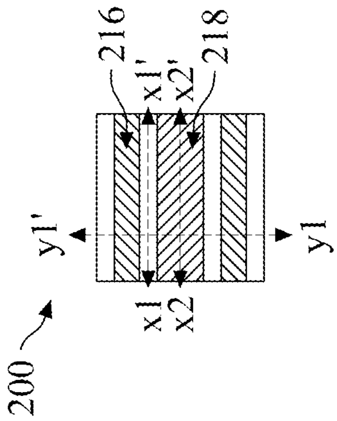
Figure 5B:
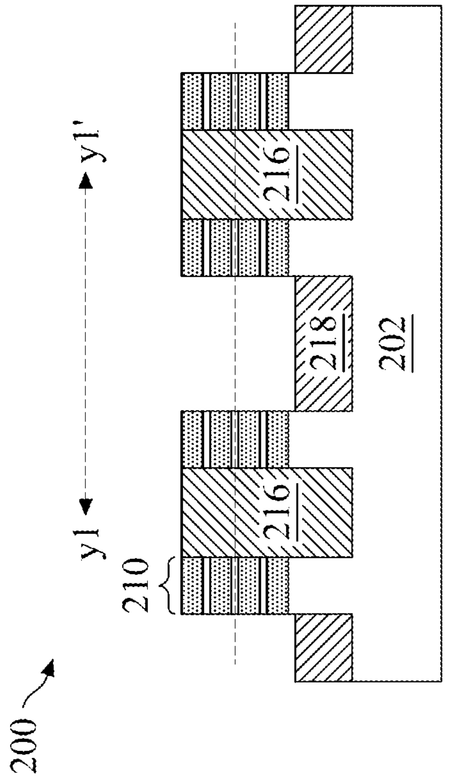
Figure 5C:
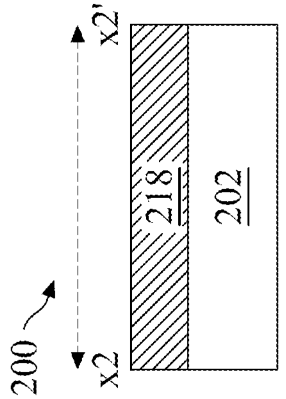
Figure 5D:
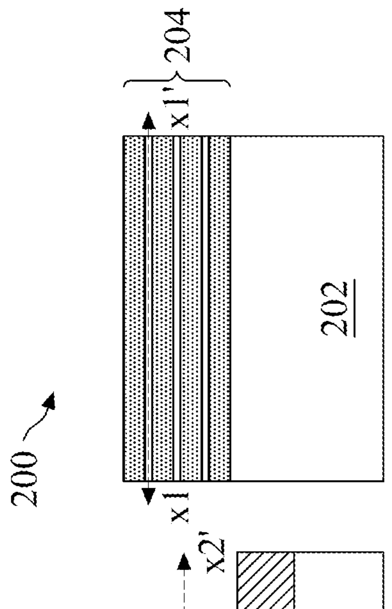

In some embodiments, including as represented in FIGS. 2B and 2D, the stack 204 may include a plurality of channel layers 208 interleaved by a plurality of sacrificial layers 206. The layers in the stack 204 may be deposited over the substrate 202 using an epitaxial process. Example epitaxial process may include vapor-phase epitaxy (VPE), ultra-high vacuum CVD (UHV-CVD)), molecular beam epitaxy (MBE), and/or other suitable processes. The channel layers 208 and the sacrificial layers 206 may have different semiconductor compositions. In some implementations, the channel layers 208 are formed of silicon (Si) and sacrificial layers 206 are formed of silicon germanium (SiGe). The additional germanium (Ge) content in the sacrificial layers 206 allow selective removal or recess of the sacrificial layers 206 without substantial damages to the channel layers 208. The sacrificial layers 206 and the channel layers 208 are disposed alternatingly such that sacrificial layers 206 interleave the channel layers 208. FIGS. 2B and 2D illustrate four (4) layers of the sacrificial layers 206 and three (3) layers of the channel layers 208 are alternately and vertically arranged, which is for illustrative purposes only and not intended to be limiting beyond what is specifically recited in the claims. The number of layers depends on the desired number of channels regions for the semiconductor device 200. In some embodiments, the number of the channel layers 208 is between 1 and 6.

Block 102 includes, and FIG. 2B illustrates, the stack 204 and the substrate 202 are patterned to form fin-shaped structures 210 separated by trenches 212, which are annotated as small trench 212B and large trench 212A. The width in the Y direction of the "small" trench 212B is less than the width in the Y direction of the "large" trench 212A.

To pattern the stack 204 and the substrate 202, a hard mask layer may be deposited over the top sacrificial layer. The hard mask layer is then patterned to serve as an etch mask to pattern the stack 204 and a portion of the substrate 202. In some embodiments, the hard mask layer may be deposited using CVD, plasma-enhanced CVD (PECVD, atomic layer deposition (ALD), plasma-enhanced ALD (PEALD), or a suitable deposition method. The hard mask layer may be a single layer or a multilayer such as a pad oxide and a pad nitride layer. The fin-shaped structures 210 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern a hard mask layer which may be used as an etch mask to etch the stack 204 and the substrate 202 to form fin-shaped structures 210. The etching process can include dry etching, wet etching, reactive ion etching (RIE), and/or other suitable processes. The fin-shaped structures 210 may be referred to as active regions, as the regions define the position where a subsequent device feature such as a channel region is formed.

In some implementations, the fin-shaped structures 210 includes a portion formed of the substrate 202 and a portion defined by the stack 204. The fin-shaped structures 210 extend lengthwise along the X direction as shown in FIG. 2A and extend vertically in the Z direction rising above the substrate 202. Along the Y direction, the two fin-shaped structures 210 in FIG. 2B are separated from one another by the trench 212A while they are separated from other adjacent fin-shaped structures by separation trenches 212B. A width of the separation trenches 212A may be greater than a width of the trench 212B along the Y direction. In some embodiments, a width d1 of the trench 212A is between about 30 and about 50 nanometers (nm). In some embodiments, a width d1 of the trench 212A is greater than about 50 nm. In a further embodiment, a width d1 of the trench 212A is between approximately 80 nm and approximately 500 nm. In some implementations, the trench 212A is provided as a large isolation space (e.g., a shallow trench isolation (STI) region or cell). In some implementations, the trench 212A is provided as a large isolation space of a special functioning cell. In some implementations, the separation trenches 212A are disposed over a junction of an n-type well region and a p-type well region.

A width of the separation trenches 212B may be less than a width of the trench 212A along the Y direction. In some embodiments, a width d2 of the trench 212B is between about 37 nanometers (nm) and about 25 nm. The small separation trenches 212B may define where a dielectric wall is formed. In some implementations, the ratio of d1:d2 is about 1.3:1 to about 4:1. In some implementations, the ratio of d1:d2 is about 4:1 to about 50:1.

In block 104 of the method 100, a dielectric fin is formed within a trench between active regions formed in block 102. Referring to FIGS. 1 and 3A, 3B, 3C, and 3D, an embodiment of a block 104 includes a dielectric layer 214 over the device 200. The layer 214 is conformally deposited over the device 200 including in the trench 212B (and the trench 212A). The layer 214 may be conformally deposited using CVD, ALD, high density plasma CVD (HDPCVD), or other suitable method. In an embodiment, the layer 214 includes a multi-layer composition such as a first layer that lines the sidewalls and bottom surfaces of the trenches 212, and a second layer deposited over the first layer. In an embodiment, the layer 214 is a dielectric material. For example, silicon nitride, silicon carbonitride, silicon oxycarbonitride, aluminum nitride, aluminum oxynitride, zirconium nitride, silicon oxynitride, or other suitable dielectric material. In some embodiments, the layer 214 is a single layer formed of a nitride-based dielectric material such as silicon nitride, silicon carbonitride, silicon oxycarbonitride, aluminum nitride, aluminum oxynitride, zirconium nitride, silicon oxynitride, or a suitable dielectric material. In an embodiment, the layer 214 is of sufficient thickness to fill the trench 212B. In a further embodiment, the layer 214 is of a thickness such that at least portion of the trench 212A remains empty.

After the deposition of layer 214, the deposited layer 214 is etched back to expose a top of the stack 204, e.g., top sacrificial layer 206, forming a dielectric wall or fin 216 as illustrated in FIGS. 4A, 4B, 4C, 4D. In some implementations, due to the loading effect, the material of the layer 214 is removed in the wider and more accessible separation trenches 212A, while the deposited layer 214 filling the narrower trench 212B remains. The layer 214 remains in the trench 212B to become the dielectric wall 216. In some embodiments, the layer 214 may be etched back in a dry etch process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

In block 106 of the method 100, an isolation feature, also referred to as a shallow trench isolation (STI) feature, is formed within a trench between active regions formed in block 102. Referring to FIGS. 1 and 5A, 5B, 5C, and 5D, in an embodiment of a block 106, an isolation feature 218 is formed in the trench 212A. The isolation feature 218 may be referred to as a shallow trench isolation (STI) feature 218. In an example process to form isolation feature 218, a dielectric material is deposited over the device 200, filling the trench 212A with the dielectric material. In some embodiments, the dielectric material may tetraethylorthosilicate (TEOS)

oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various examples, at block 106, the dielectric material may be deposited by flowable CVD (FCVD), spin-on coating, and/or other suitable process. The deposited dielectric material is then thinned and planarized, for example by a chemical mechanical polishing (CMP) process, until a top sacrificial layer 206 is exposed. After the planarization, the deposited dielectric material is etched back such that the fin-shaped structures 210 rises above the isolation feature 218.

In block 108 of the method 100, a dummy gate also referred to as a polysilicon gate or simply poly gate stack is formed over the channel regions of the fin-shaped structures. In some embodiments such as discussed here, a gate replacement process (or gate-last process) is adopted where the poly gate stack serves as a placeholder for a functional gate structure. Other processes and configuration are possible. As shown in example of FIGS. 6A, 6B, 6C, and 6D, a dummy gate stack includes a dummy electrode 220 and a dummy dielectric layer 222. The regions of the fin-shaped structures 210 underlying the dummy gate stack including dummy electrode 220 may be referred to as channel regions. Each of the channel regions in the fin-shaped structure 210 is sandwiched between two source/drain regions for source/drain formation as discussed below. In an example process, the dummy dielectric layer 222 is blanketly deposited over the device 200 by CVD. A dummy electrode layer, such as polysilicon, is then blanketly deposited over the dummy dielectric layer 222. In some embodiments, the dummy dielectric layer 222 may include silicon oxide and the dummy electrode 220 may include polycrystalline silicon (polysilicon).

The dummy dielectric layer 222 and the semiconductor layer for the dummy electrode 220 are then patterned using photolithography processes to define the dummy gate stack extending in the Y direction, perpendicular to the X direction in which the active regions extend. After photolithography processes to define a pattern, the dummy dielectric layer 222 and the semiconductor layer for the dummy electrode 220 are etched back in a dry etch process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

The patterning of the dummy dielectric layer 222 and the semiconductor layer for the dummy electrode 220 also includes forming an opening 226 defined by a poly end wall 224 of the dummy gate dielectric 22 and the dummy electrode 220. The poly end wall 224 is a termination of the dummy electrode 220 and dummy dielectric layer 222 to form an opening 226 between gate electrode segments (annotated segment 220A and segment 220B in FIGS. 6A, 6B). The opening 226 defines a separation between two collinear gate segments extending in the Y direction. Providing the opening 226 for the first gate isolation structure (discussed below) over the dielectric wall 216 may allow for reduced risk of bending, wiggling or collapse of the dummy gate electrode 220.

A separation of a distance t2 between edges of the collinear gate electrodes segments 220A and 220B is provided when measured at a centerline of the gate segment(s). In some implementations, the distance t2 is between about 5 nm and about 25 nm. In some embodiments, the poly end wall 224 is a curvilinear sidewall to the dummy gate (e.g., dummy electrode 220) as shown in the top view of FIG. 6A including the insert. In some implementations, the length of the dummy electrode 220 that exhibits a rounded sidewall, referred to as an edge round portion, is a distance of t1. In some implementations, the distance t1 is between about 1 nm and about 37 nm. The poly end wall 224 also defines a separation distance of t3 at the edge of the dummy electrode 220 (e.g., a distance t3 may be measured collinear with a sidewall extending in the Y direction of the dummy electrode 220). In some implementations, the distance t3 is greater than the distance t2. In some implementations, a ratio of t3/t2 is between approximately 1.2 and 10, or in other implementations, between about 1.2 and about 3. In an embodiment, t3 is at least about 1.2 times t2. In an embodiment, the greater the difference the t2 and t3 allows for a larger margin for providing a portion of the poly end wall 224 linearly over the dielectric wall 216. In an embodiment, the extent of the curvature of the end regions (which may determine the t3/t2) can affect the ease of removal of the dummy gate electrode in the replacement gate process.

Figures 6A, 6B, 6C, 6D:
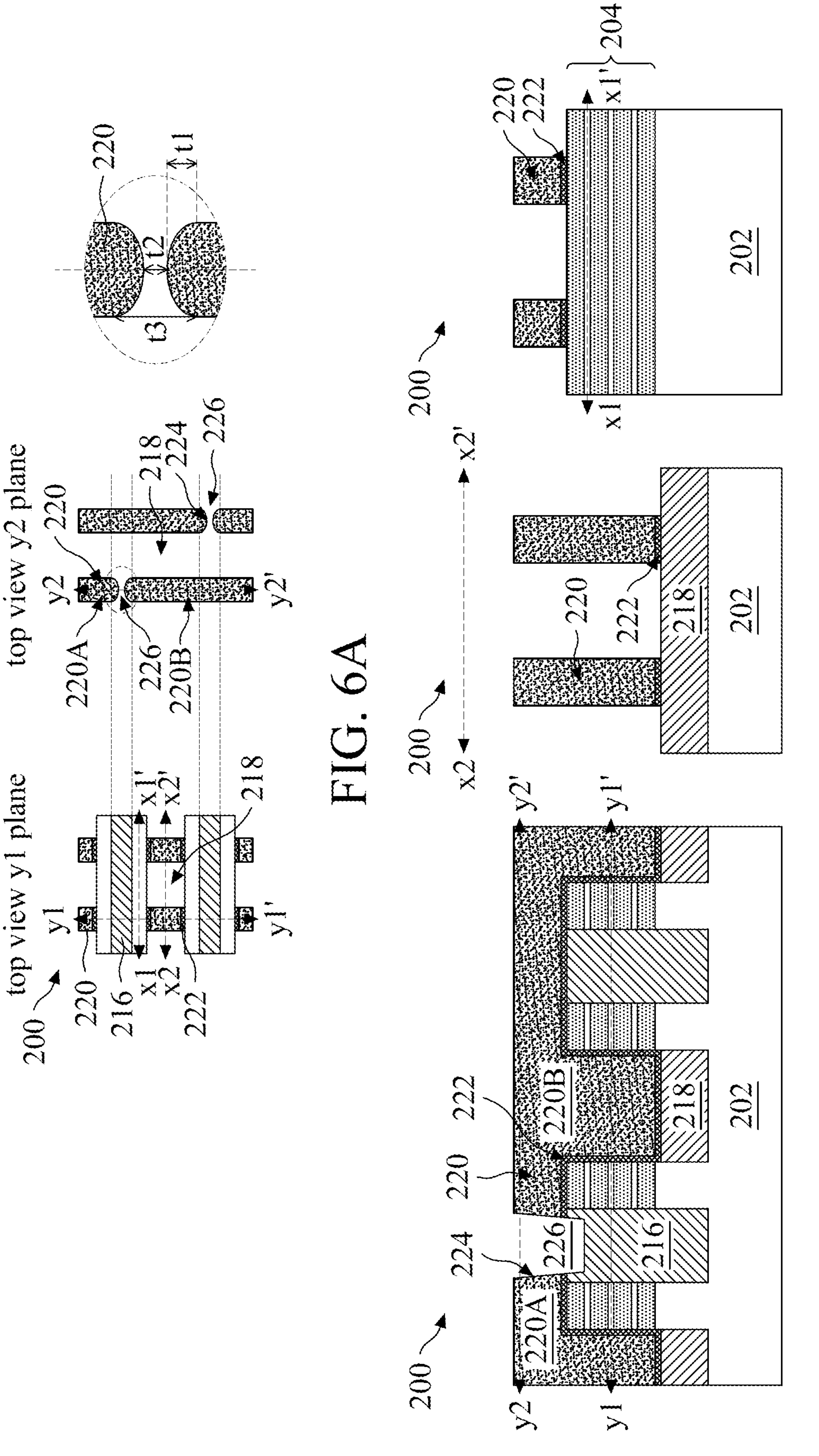
FIGS. 6E and 12E illustrate layout views of the corresponding device according to one or more aspects of the present disclosure.

It is noted that the patterning of the dummy electrode 220 and the dummy dielectric layer 222 including to form the opening 226 may in some implementations include an over-etch such that an opening 226 defined by the poly end wall 224 may extend into a top portion of the dielectric wall 216 as shown in FIG. 6B. As also illustrated in FIG. 6B, the poly end wall 224 may be tapered sidewall of the dummy electrode 220. The poly end wall 224 may be tapered in the Z direction as illustrated in a Y direction cross-section (see FIG. 6B) while also being rounded in the X direction and Y direction as viewed from a top view (see FIG. 6A).

It is noted that FIGS. 6A, 6B, 6C, and 6D illustrate the patterning of the dummy gate stack including forming the opening 226 in one step. That is, in some implementations, a single step of patterning followed by etching patterns the dummy gate stack structure from a blanket dummy gate dielectric layer and a dummy electrode layer. That is, a patterning process defines both the gate line (e.g., extension in the Y direction of the gate structure) and the gate line ends (e.g., poly end wall 224). In other implementations, two patterning and/or etching processes may be performed separately where the dummy gate stack is first patterned to form gate lines extending in the Y direction having a separation between the gate lines in the X direction. And subsequently patterned to form the poly end walls defining openings between gate segments collinear in the Y direction.

FIG. 6E is illustrative of a device layout 200' that is corresponding to device 200. The layout 200' illustrates layers defining the active region 210' and dielectric walls 216' that interpose the active regions 210'. A plurality of gate lines 220' extend perpendicularly to the active regions 210'. The device layout 200' defines a spacing 602 that are openings between segments of the gate line (or structure) 220'. The layout 200' illustrates that the spacing 602 is disposed over the dielectric wall 216'. The spacing 602 may define the opening 226 as illustrated in FIGS. 6A, 6B. In some implementations, the spacing 602 has an edge that is substantially aligned with an edge of the dielectric wall 216' and the active regions 210'. It is noted that the spacing 602 may be substantially rectangular in shape, however in fabrication in some implementations a rounding of the gate ends such as illustrated in FIG. 6A may be formed.

The layout 200' may be provided by and/or stored by a processing system. The processing system includes a processor, which may include a central processing unit, input/output circuitry, signal processing circuitry, and volatile and/or non-volatile memory. Processor receives input, such as user input, from input device such as one or more of a keyboard, a mouse, a tablet, a contact sensitive surface, a stylus, a microphone, and the like at some instances by a design engineer. Processor may also receive input, such as standard cell layouts, cell libraries, models, and the like, from a machine readable permanent storage medium. The layout 200' may be stored in machine readable permanent storage medium. One or more integrated circuit manufacturing tools, such as a photomask generator may communicate with machine readable permanent storage medium, either locally or over a network, either directly or via an intermediate processor such as processor. In one embodiment, photomask generator generates one or more photomasks to be used in the manufacture of an integrated circuit, in conformance with the layout 200' stored in machine readable permanent storage medium. In some implementations, the alignment of the spacing 602 may be controlled by design rules and verified using a design rule checker (DRC).

Figure 6F:
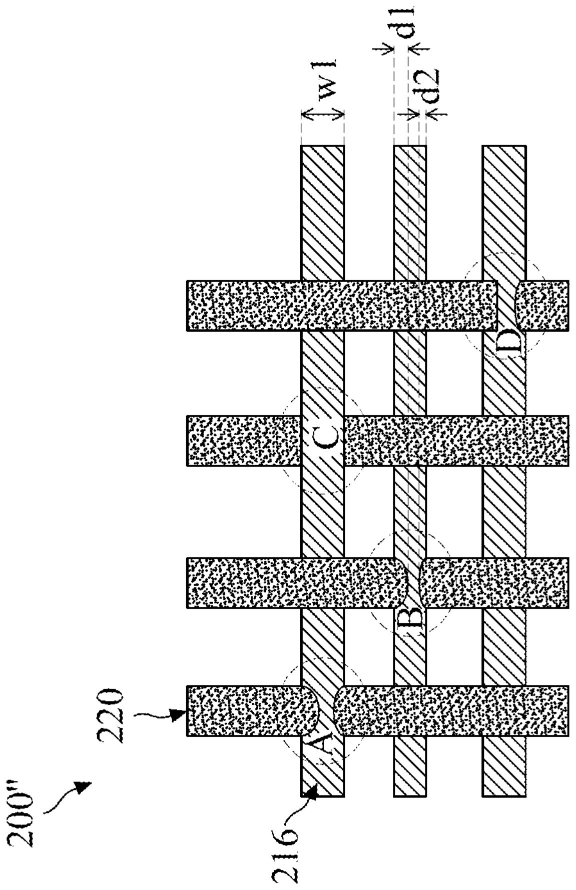
Figure 6E:
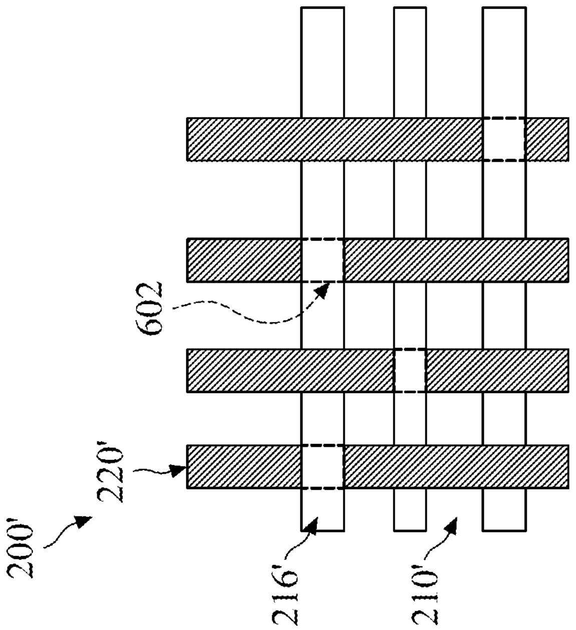
Figure 7A:
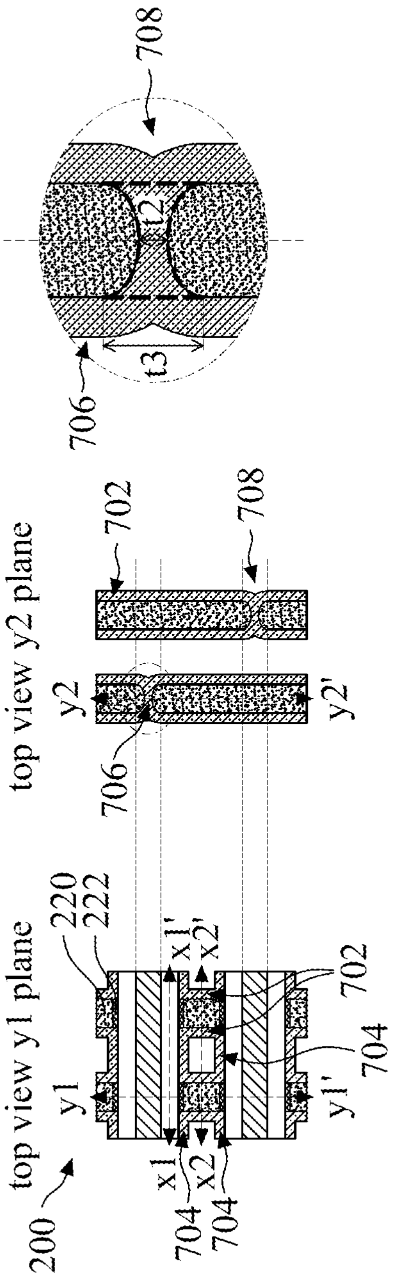
Figure 7D:
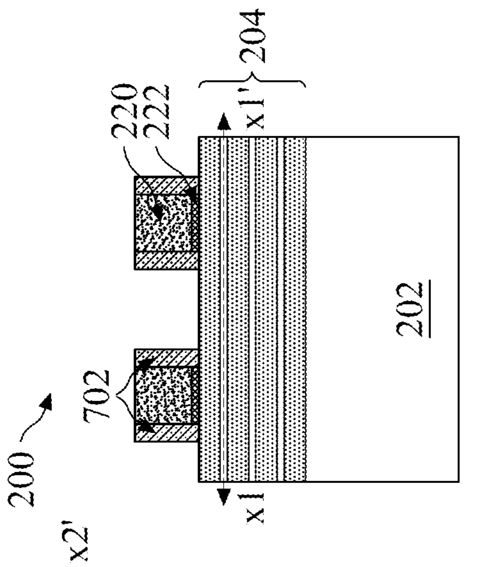
Figure 7C:
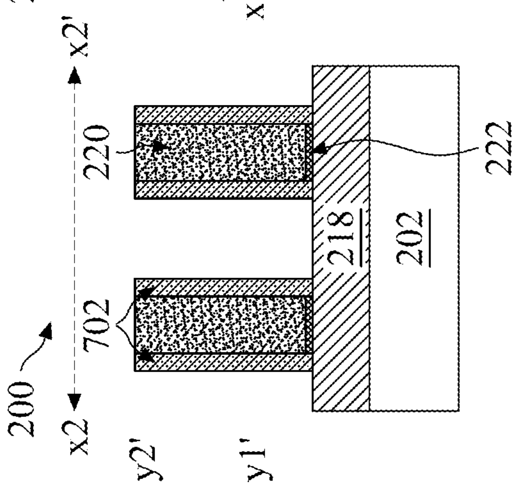
Figure 7B:
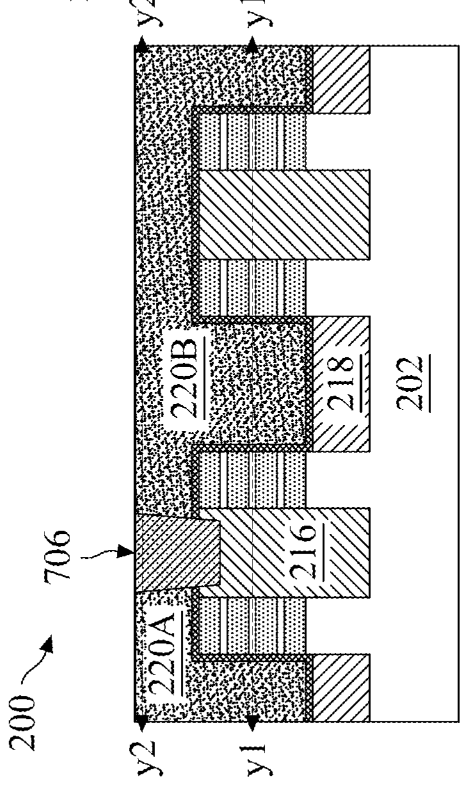
Figure 7E:
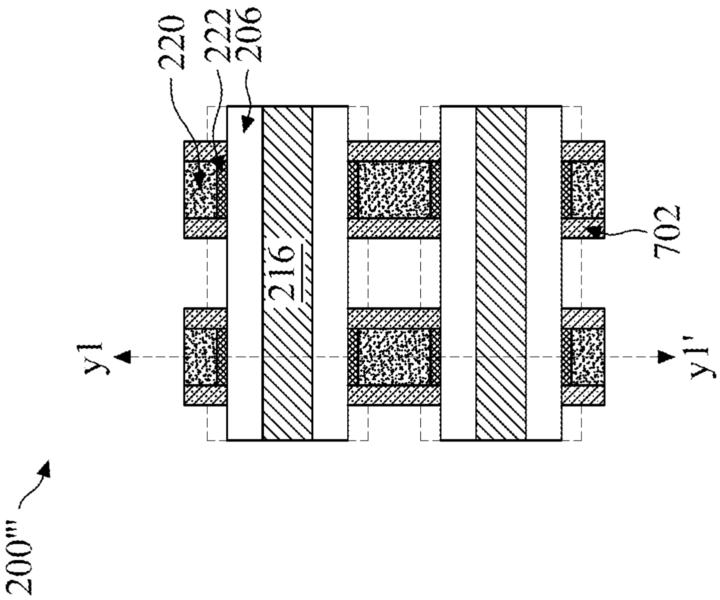

FIG. 6F is illustrative of an exemplary device 200" formed of the layout 200' including gate structures (e.g., polysilicon dummy gate electrodes 220), dielectric walls 216 and active regions (e.g., fin-shaped structures) 210. As illustrated in region A of FIG. 6F, in some implementations the gate line segments defining an edge of the spacing 602, for example poly end wall 224 discussed above, is curved and extends over a portion of the dielectric wall 216. As illustrated in region D, in some implementations the gate line segments defining an edge of the spacing 602, for example poly end wall 224 discussed above, is substantially linear and extends over a portion of the dielectric wall. In some implementations, the gate electrodes 220 is disposed over 95% or less of the dielectric wall 216 (e.g., leaving approximately 5% or more of the width w1 (measured in the Y direction on FIG. 6F) free of the overlying gate electrode 220). As illustrated in region B of the device 200", in some implementations, a first gate segment 220 (lower) and a second collinear dummy gate electrode segment 220 (upper) extend different distances over the dielectric wall 216. Thus, the spacing 602 may be shifted from a center of the dielectric wall 216. In the example of region B, the spacing 602 has extends a first distance d1 over the dielectric wall 216 top edge, and extends a second distance d2 over the dielectric wall 216 bottom edge where d1 is greater than d2. In some implementations, d2 is zero. It is noted that the example of region B provides rounded gate segment ends; in other implementations, the gate segment ends are substantially linear or oblique. As illustrated in region C of the device 200", in some implementations, a first gate electrode segment 220 (lower) and a second collinear gate electrode segment 220 (upper) each have an end edge that is substantially aligned with the dielectric wall 216 and the active region (fin-shaped structures 210) interface. Thus, the spacing 602 may extend across substantially the entire width w1 of the dielectric wall 216. It is noted that the example of region C provides substantially linear gate segment ends; in other implementations, the gate segment ends are rounded.

The method 100 includes a block 110 where spacers are formed. The spacers may be formed on the sidewalls of the poly gate stacks. In some implementations, spacers are also formed, concurrently or separately, on the fin-shaped structures. In some implementations, as forming the spacers (e.g., the spacers on the sidewalls of the poly gate stacks), the spacer dielectric material also fills the openings between collinear gate segments to form the first gate isolation feature (also referred to as a gate-cut structure).

Suitable dielectric materials for the spacer(s), and first gate isolation feature, may include silicon oxide ($SiO_2$), silicon nitride (SiN), silicon oxycarbonitride (SiCON), silicon carbonitride (SiCN), silicon oxycarbide (SiCO), silicon carbide (SiC), silicon oxynitride (SiON), aluminum oxide (AlO), zirconium silicate ($ZrSiO_4$), hafnium silicate ($HfSiO_4$), combinations thereof, high-k dielectric materials including those described herein, and/or other suitable dielectric materials. In an example process, the dielectric material to form a gate spacer 702, a fin spacer 704, and/or a gate isolation structure 706 may be conformally deposited over the device 200 using CVD, subatmospheric CVD (SACVD), ALD, or other suitable process. As shown in the example of FIGS. 7A, 7B, 7C, and 7D, dielectric material forms the gate spacer 702 along sidewalls of the dummy gate stack including the dummy gate electrode 220. Dielectric material also forms a fin spacer 704 along the sidewalls of the fin-shaped structures 210. As the dielectric material(s) are deposited and etched to form spacers 702, 704, the dielectric material also fills the opening 226 between poly end walls 224 to form the gate-cut or gate isolation structure 706. The gate isolation structure 706 corresponds to the spacing 602 defined in the layout 200'.

The gate isolation structure 706 extends from the sidewalls of the gate electrode segments 220A to the sidewalls of the gate segments 220B. The distance of separation between gate segments and thus the length of the gate isolation structure 706 may be t2 in a top view at a centerline of the gate segments and t3 in a top view at an edge of the gate segments (e.g., a line collinear with an edge of the gate segments). In some implementations, t3 may be greater than t2 as discussed above.

In some embodiments, the height of the fin spacer 704 is adjusted in or after the formation process. In some embodiments, fin spacers 704 are omitted as illustrated in the device 200' of FIG. 7E with the position of the fin spacer 704 location illustrated in dashed lines. In an embodiment, the formation of the gate isolation structure 706 includes forming a notch 708. The notch 708 is aligned with a center of the spacing between collinear gate segments 220.

The method 100 includes block 112 where source and drain features are formed. Block 112 may include recessing the source/drain regions of the fin-shaped structures 210 are recessed to form source/drain recesses adjacent the dummy gate electrode 220. In some implementations, the block 112 may completely remove the sacrificial layers 206 and channel layers 208 in the source/drain regions of the fin-shaped structures 210. The etching the recess may be an anisotropic etch such as a dry etch process. For example, the dry etch process may implement hydrogen ($H_2$), a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

When forming the recesses, sidewalls of the channel layers 208 and the sacrificial layers 206 under the dummy gate electrode 220 are exposed. The sacrificial layers 206 may then be slightly recessed from the edge of the source/drain recess and subsequently, inner spacer features 802 are formed in the recessed areas. For example, in some implementations, the sacrificial layers 206 exposed in the source/drain trenches are first selectively and partially recessed to form inner spacer recesses, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone. In some other embodiments, the selective recess may include a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). After the formation of the inner spacer recesses, an inner spacer material layer is then conformally deposited using CVD or ALD over the device 200, including over and into the inner spacer recesses. The inner spacer material may include silicon nitride, silicon oxycarbonitride, silicon carbonitride, silicon oxide, silicon oxycarbide, silicon carbide, silicon oxynitride, and/or other materials. After the deposition of the inner spacer material layer, the inner spacer material layer is etched back to form inner spacer features 802, as illustrated in FIG. 8D.

Figures 8A, 8B, 8C, 8D:
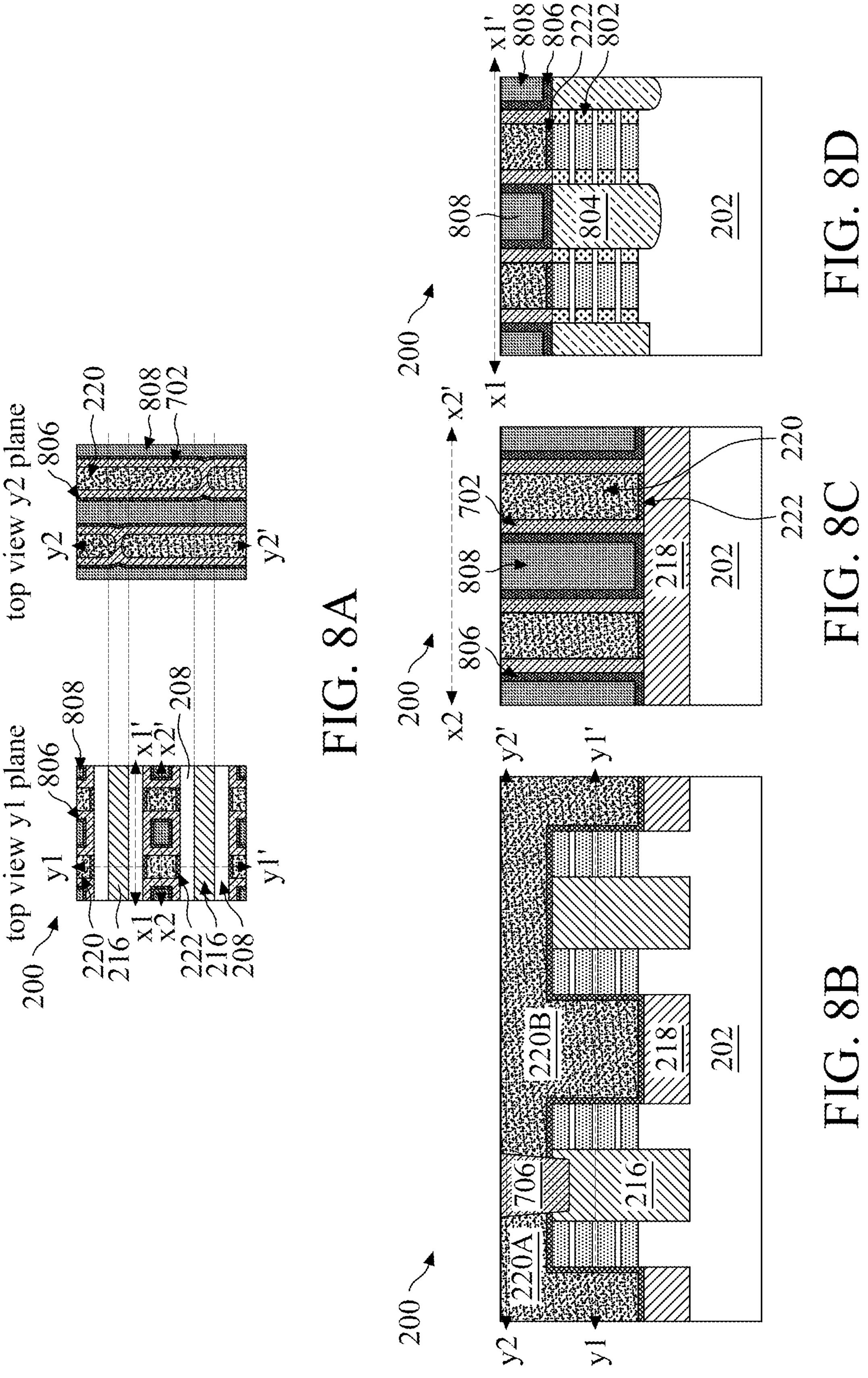
Figure 9A:
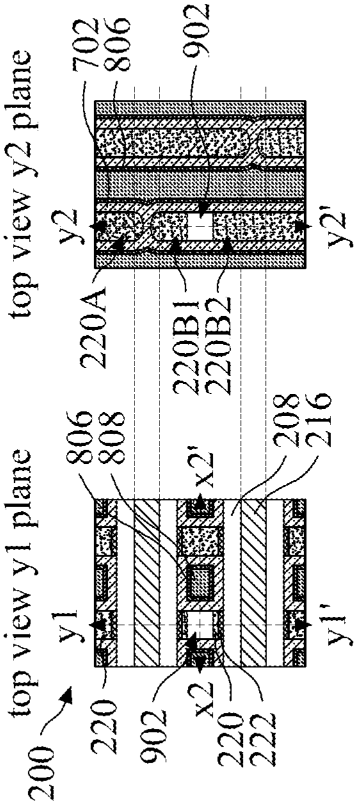
Figure 9B:
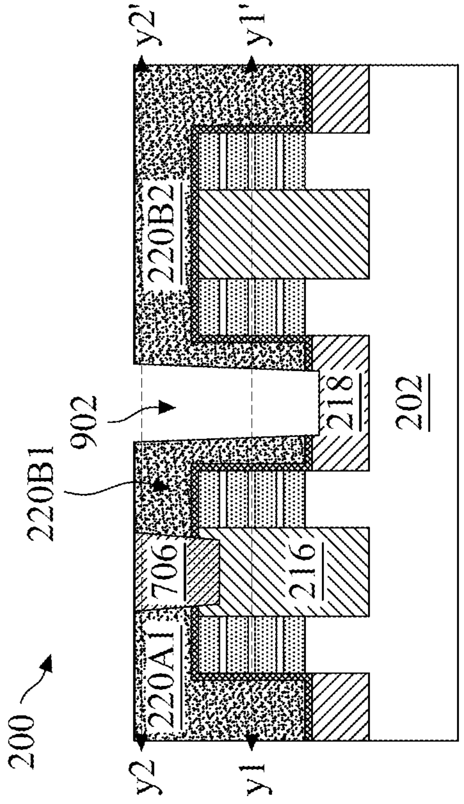
Figure 9C:
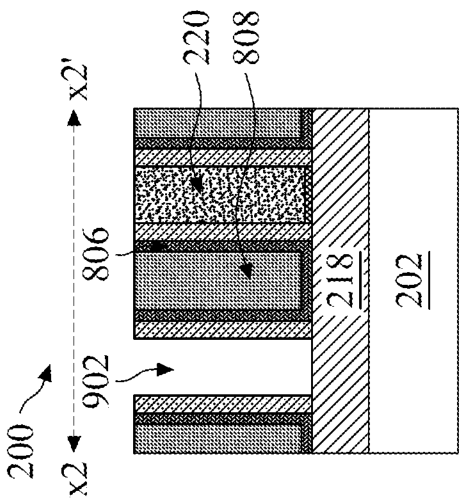

Source/drain features 804 are formed in the source/drain recesses (see FIG. 8D). The source/drain features 804 are selectively and epitaxially deposited on the exposed semiconductor surfaces of the channel layers 208 and the substrate 202 in the source/drain trenches. The source/drain feature 804 may be deposited using an epitaxial process, such as vapor-phase epitaxy (VPE), ultra-high vacuum CVD (UHV-CVD), molecular beam epitaxy (MBE), and/or other suitable processes. In some embodiments where a complementary metal oxide semiconductor field effect transistor (CMOSFET) is desired, one of the source/drain features 804 is n-type and may include silicon (Si) doped with an n-type dopant, such as phosphorus (P) or arsenic (As) and the other is p-type and may include silicon germanium (SiGe) doped with a p-type dopant, such as boron (B) or gallium (Ga). Doping of the source/drain feature 804 may be performed either in situ with their deposition or ex situ using an implantation process, such as a junction implant process.

The method 100 includes a block 114 where dielectric layers are formed over the device including the source/drain features. In some implementations, as shown in FIGS. 8A, 8B, 8C, and 8D, the dielectric layers may include a contact etch stop layer (CESL) 806 and/or an interlayer dielectric (ILD) layer 808. In some embodiments, the CESL 806 is first conformally deposited over the device 200 and then the ILD layer 808 is blanketly deposited over the CESL 806. The CESL 806 may include silicon oxide ($SiO_2$), silicon nitride (SiN), silicon oxycarbonitride (SiCON), silicon carbonitride (SiCN), silicon oxycarbide (SiCO), silicon carbide (SiC), silicon oxynitride (SiON), aluminum oxide (AlO), zirconium silicate ($ZrSiO_4$), hafnium silicate ($HfSiO_4$), combinations thereof, high-k dielectric materials including those described herein, and/or other suitable dielectric materials, and/or other materials known in the art. The CESL 806 may be deposited using ALD, plasma-enhanced chemical vapor deposition (PECVD) process and/or other suitable deposition or oxidation processes. In some embodiments, the CESL 806 is different composition than the spacer 702, 704. In some embodiments, the ILD layer 808 may include materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), SiON, SiCO, AlO, and/or other suitable dielectric materials. The ILD layer 808 may have a different composition than the CESL 806 and/or the spacers 702, 704. The ILD layer 808 may be deposited by spin-on coating, an FCVD process, or other suitable deposition technique. In some embodiments, after formation of the ILD layer 808, the device 200 may be annealed to improve integrity of the ILD layer 808. To remove excess materials and to expose top surfaces of the dummy electrode 220, a planarization process (such a chemical mechanical polishing (CMP) process) may be performed to the device 200 to provide a planar top surface.

The method 100 includes block 116 where a second gate isolation (or gate-cut feature) feature is formed. The second gate isolation feature also isolates two portions of a gate line from one another. Referring to the example of FIGS. 9A, 9B, and 9C, an opening (or trench) 902 is formed in the dummy gate stack including dummy gate electrode 220 and dummy dielectric layer 222 extending to the isolation feature 218. After photolithography processes to define a pattern, the dummy dielectric layer 222 and the semiconductor layer for the dummy electrode 220 are etched back in a dry etch process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the opening 902 includes tapered sidewalls. In some implementations, the etching stops at a top surface of the isolation feature 218 as shown. In other embodiments, an overetching is performed and an upper portion of the isolation feature 218 is removed within the opening 902.

Figure 10A:
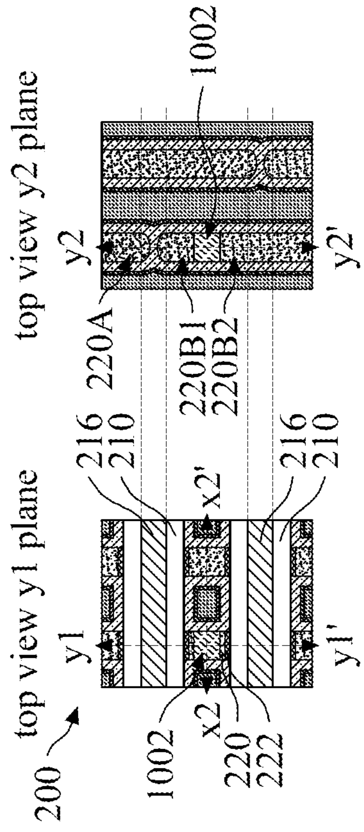
Figure 10C:
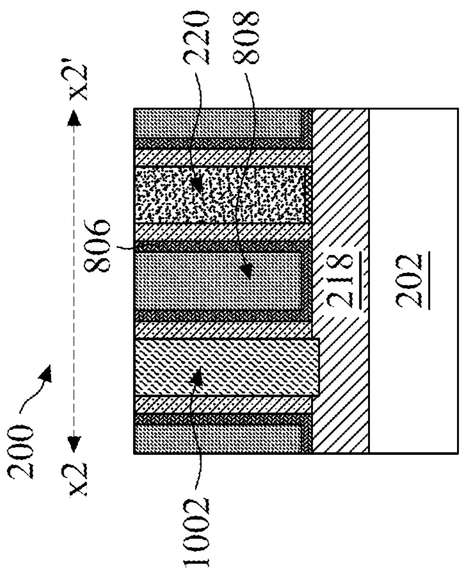
Figure 10B:
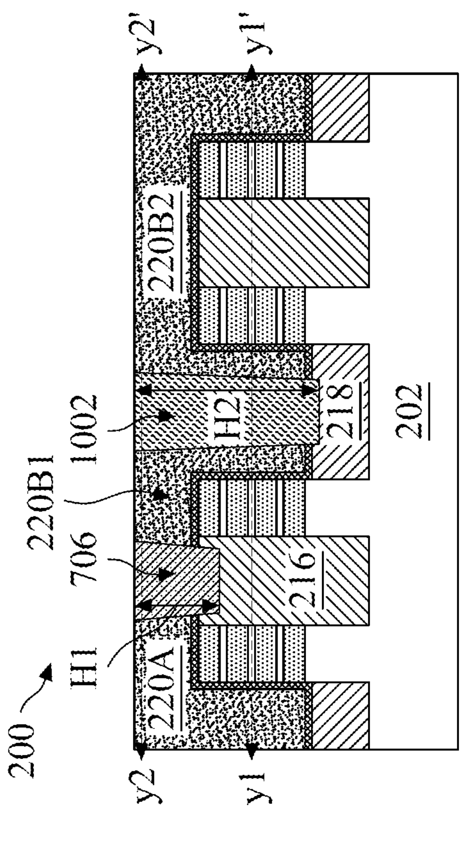

Block 116 continues to fill the opening 902 with isolation material to form gate isolation structure 1002 as shown in FIGS. 10A, 10B, 10C. Suitable dielectric materials for the gate isolation structure 1002 may include silicon nitride, silicon oxycarbonitride, silicon carbonitride, silicon oxycarbide, silicon carbide, silicon oxynitride, combinations thereof, and/or other suitable dielectric materials. In an example process, the isolation material may be conformally deposited over the device 200 using CVD, subatmospheric CVD (SACVD), ALD, or other suitable process. After deposition, a chemical mechanical planarization (CMP) and/or etching back process is performed that removes the isolation material from the dummy gate electrode 220 providing a planar top surface forming the gate isolation structure 1002 as seen in FIGS. 10B, 10C.

In an embodiment, the gate isolation structure 1002 provides an isolation between segments of the dummy gate (e.g., the dummy gate electrode 220) (and thus, the later formed gate structures) providing dummy electrode segment 220B1 separated from the dummy electrode segment 200B2. Thus, the gate isolation structure 706 provides an isolation between segments of the dummy electrode 220 (and thus, the later formed gate structures) electrically isolating the dummy electrode segment 220A isolated from the dummy electrode segment 220B1.

In an embodiment, the height H1 in the Z direction of the gate isolation structure 706 is between about 6 nm and about 30 nm. In an embodiment, the height H2 in the Z direction of the gate isolation structure 1002 is between about 30 nm and about 300 nm. In an embodiment, the ratio of H2:H1 is between about 2:1 and about 37:1. In an embodiment, the ratio of H2:H1 is between about 2:1 and about 20:1. In an embodiment, the gate isolation structure 1002 extending to the STI 218 and the gate isolation structure 706 extending to the dielectric wall 216 have different compositions.

The method 100 includes block 118 where the dummy gate stacks are removed and the channel layers in the channel regions of the fin-shaped structures are released to form the channel members. Referring to the example of FIGS. 11A, 11B, 11C, and 11D, the channel layers 208 in the channel regions are released to form channel members 208' by removing the sacrificial layers 206. The channel members 208' are provided as a stack (e.g., a plurality of vertically disposed members). The dummy gate stack (dummy electrode 220 and/or dummy dielectric layer 222) are removed from the device 200 by a selective etch process to form a portion of the opening 1102 and the removal of the sacrificial layers 206 are removed to form a portion of the opening 1102. The selective etch process(es) may be a selective wet etch process, a selective dry etch process, or a combination thereof. In the depicted embodiments, a selective etch process selectively removes the dummy dielectric layer 222 and the dummy electrode 220 without substantially etching the gate spacer 702. After the removal of the dummy gate stack, channel layers 208 and sacrificial layers 206, in the channel region are exposed. The exposed sacrificial layers 206 may be selectively removed to release the channel layers 208 to form channel members 208'.

Figures 11A, 11B, 11C, 11D:
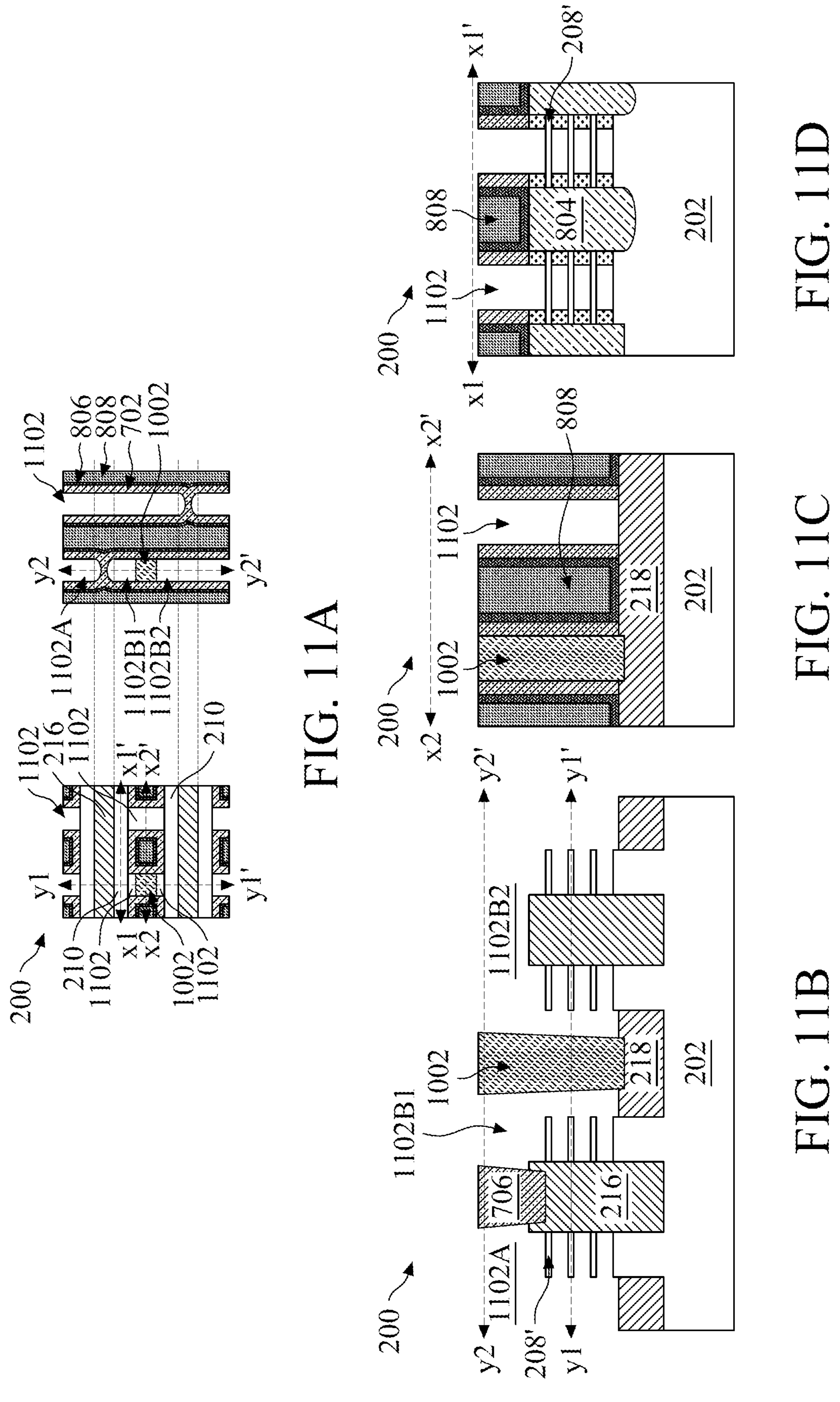

As shown in FIG. 11B, when viewed along the Y direction, the channel members 208' after being released have appearances of cantilever beams stemming from the dielectric wall 216. In embodiments where the channel members 208' resemble a sheet or a nanosheet, the channel member release process may also be referred to as a sheet formation process. After their release, the channel members 208' are in contact with the dielectric wall 216. The channel members 208' are vertically stacked along the Z direction. The selective removal of the sacrificial layers 206 may be implemented by selective dry etch, selective wet etch, or other selective etch processes. In some embodiments, the selective wet etching includes ammonium hydroxide ($NH_4OH$), hydrogen fluoride (HF), hydrogen peroxide ($H_2O_2$), or a combination thereof (e.g., an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$.

The method 100 includes block 120 where a gate structure is formed to wrap around each channel member released in block 118. Referring to the example of FIGS. 12A, 12B, 12C, 12D, a gate structure 1200 is formed to wrap around each of the channel members 208'. In some implementations, the gate structure 1200 is referred to as a metal gate structure having a metal comprising electrode. The gate structure 1200 may include a gate dielectric layer 1202 and a gate electrode layer 1204 over the gate dielectric layer 1202. In some embodiments, an interfacial layer is formed under the gate dielectric layer 1202 including on the channel members 208' and exposed substrate 202. In some embodiments, the interfacial layer includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The gate dielectric layer 1202 may be deposited using ALD, CVD, and/or other suitable methods. The gate dielectric layer 1202 may include high-k dielectric materials. In one embodiment, the gate dielectric layer 1202 may include hafnium oxide. Alternatively, the gate dielectric layer 1202 may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HMO), $(Ba,Sr)TiO_3$ (BST), silicon nitride (SiN), silicon oxynitride (SiON), combinations thereof, or other suitable material.

After the formation of the interfacial layer and the gate dielectric layer 1202, the gate electrode layer 1204 is deposited over the gate dielectric layer 1202. The gate electrode layer 1204 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), tantalum carbide (TaC), and/or other suitable materials. The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 1204 may be formed by ALD, PVD, CVD, e-beam evaporation, or other suitable process.

After formation the gate structure 1200, which is also referred to as a metal gate structure, there are multiple gate segments, or regions of the gate structure that are isolated from one another by a gate isolations structure. Three segments, 1200A, 1200B, 1200C, of the gate structure 1200 are illustrated in the cross-sectional view of FIG. 12B and top view of FIG. 12A. Each of the segments 1200A, 1200B, 1200C may be electrically insulated from one another.

Figure 12A:
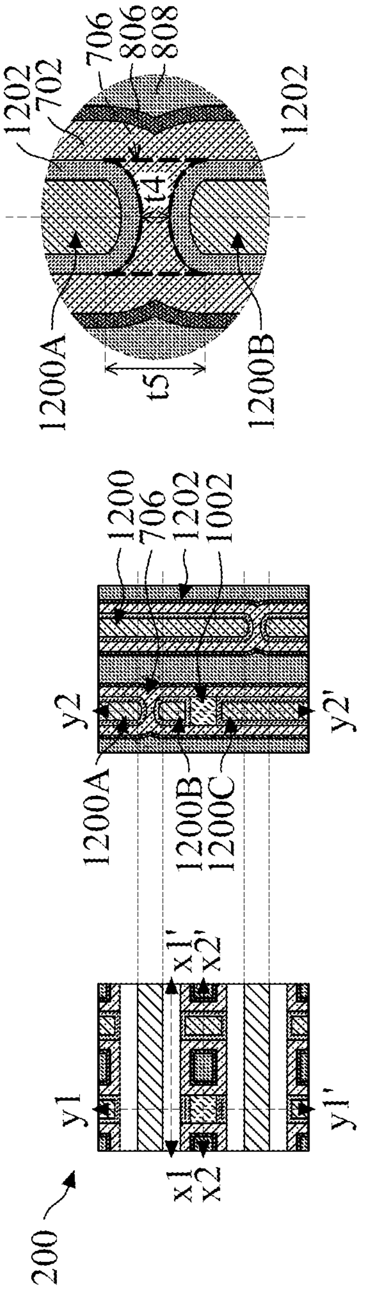
Figure 12D:
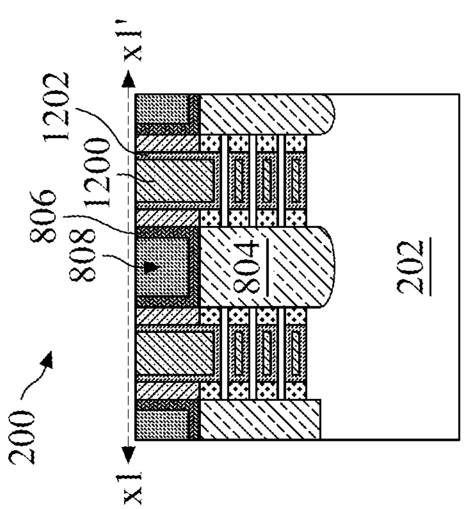
Figure 12C:
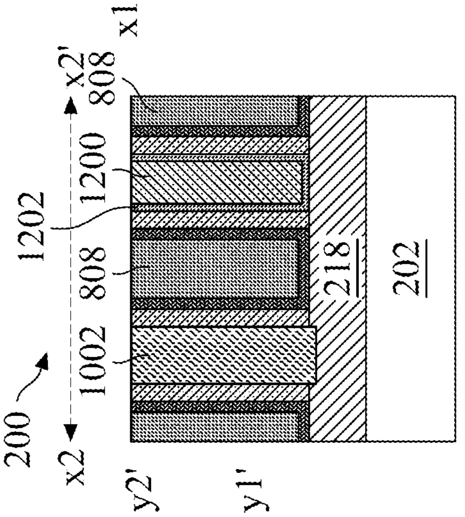
Figure 12B:
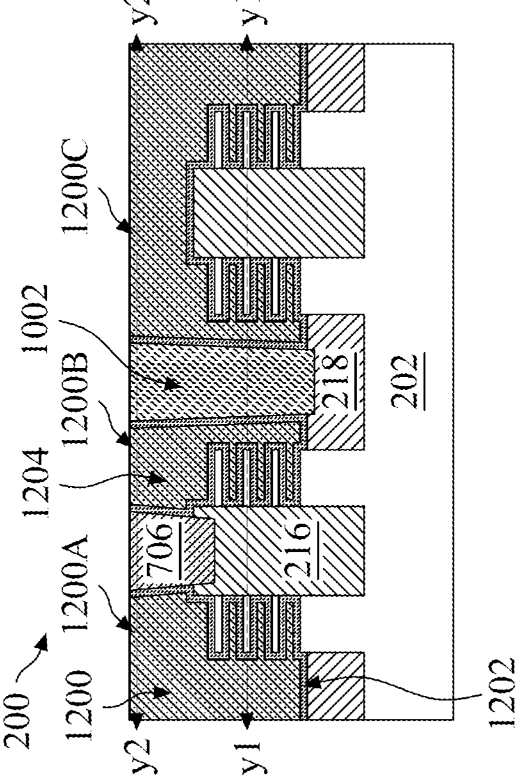
Figure 12E:
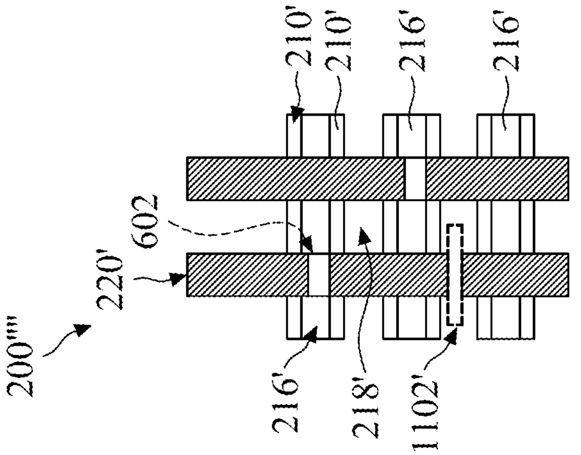

The gate isolation structure 706 from a top view exhibits a bow-tie shape, see dashed line of FIG. 12A. The bow-tie shape is defined by the isolation feature having an increased length in the top view at the edges of the feature than a middle region of the feature. For example, the isolation feature 706 has a length of t4 at a centerline of the gate structure 1200 and a length of t5 at a measurement collinear to a sidewall edge of the gate structure 1200. In some implementations, t5 is greater than t4. In an embodiment, the ratio of t5:t4 is between about 1.2:1 and about 3:1. In an embodiment, the t5 is at least 1.2 times t4.

FIG. 12E is a device layout 200" that is substantially similar to the layout 200' described above with reference to FIG. 6E. The layout 200" illustrates layers defining the active region 210' and dielectric wall 216' that interpose the active regions 210' and a plurality of gate lines 220' extend perpendicularly to the active regions 210'. As in the layout 200', the device layout 200' defines a spacing 602 that are separations between segments of the gate lines 220'; the spacings 602 correspond to the first gate isolation structure 706. The layout 200"" also includes the gate isolation region 1102', which provides a second isolation feature isolating portions of the gate lines 220' (which correspond to gate structure 1200 of FIGS. 12A-12D). The gate isolation region 110' is disposed over an isolation region 218' between active regions 210'. The layout 200"" may be provided by and/or stored by a processing system as discussed above.

The method 100 includes block 122 where continuing fabrication is performed. In some embodiments, contact features are formed to the gate structure 1200 and/or associated source/drain features. Overlying multi-layer interconnect (MLI) structures may be provided.

The method 100 and the examples of FIGS. 2A-12E are exemplary only and not intended to be limiting to the specific examples discussed therein. The following examples are also based on the method 100 and/or the device 200, but include modifications as discussed in detail below. Common reference numbers refer to common elements.

Figure 13B:
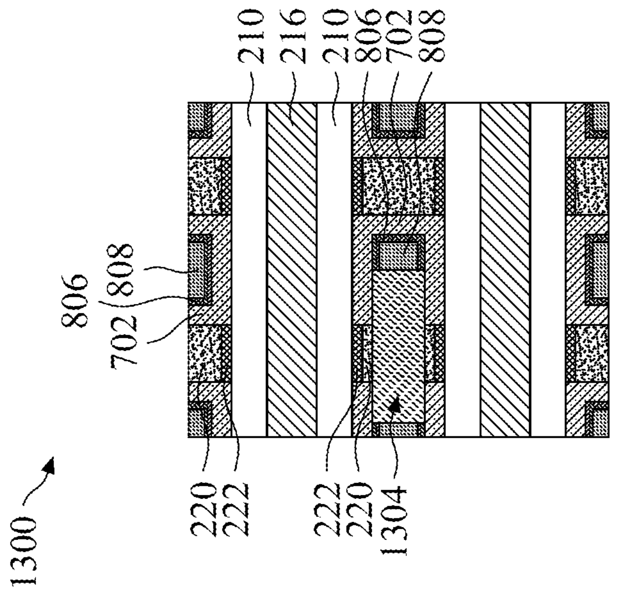
FIGS. 13A and 13B illustrate a top view of a device having another embodiment of a gate isolation feature according to one or more aspects of the present disclosure.
Figure 13A:
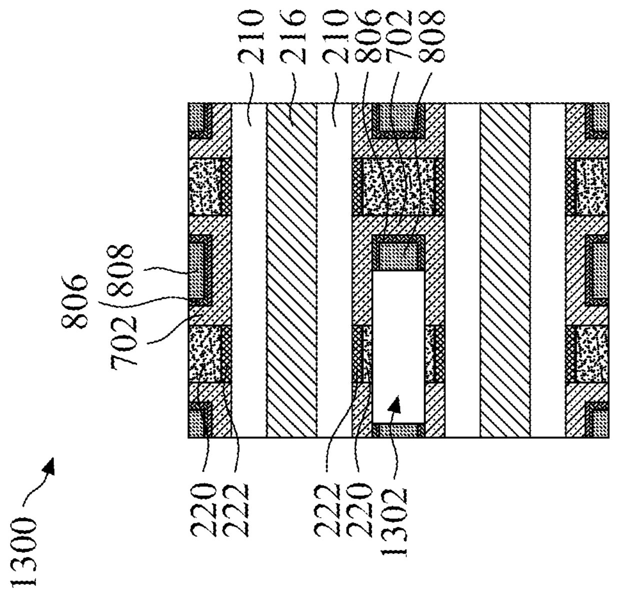
Figures 14A, 14B, 14C, 14D:
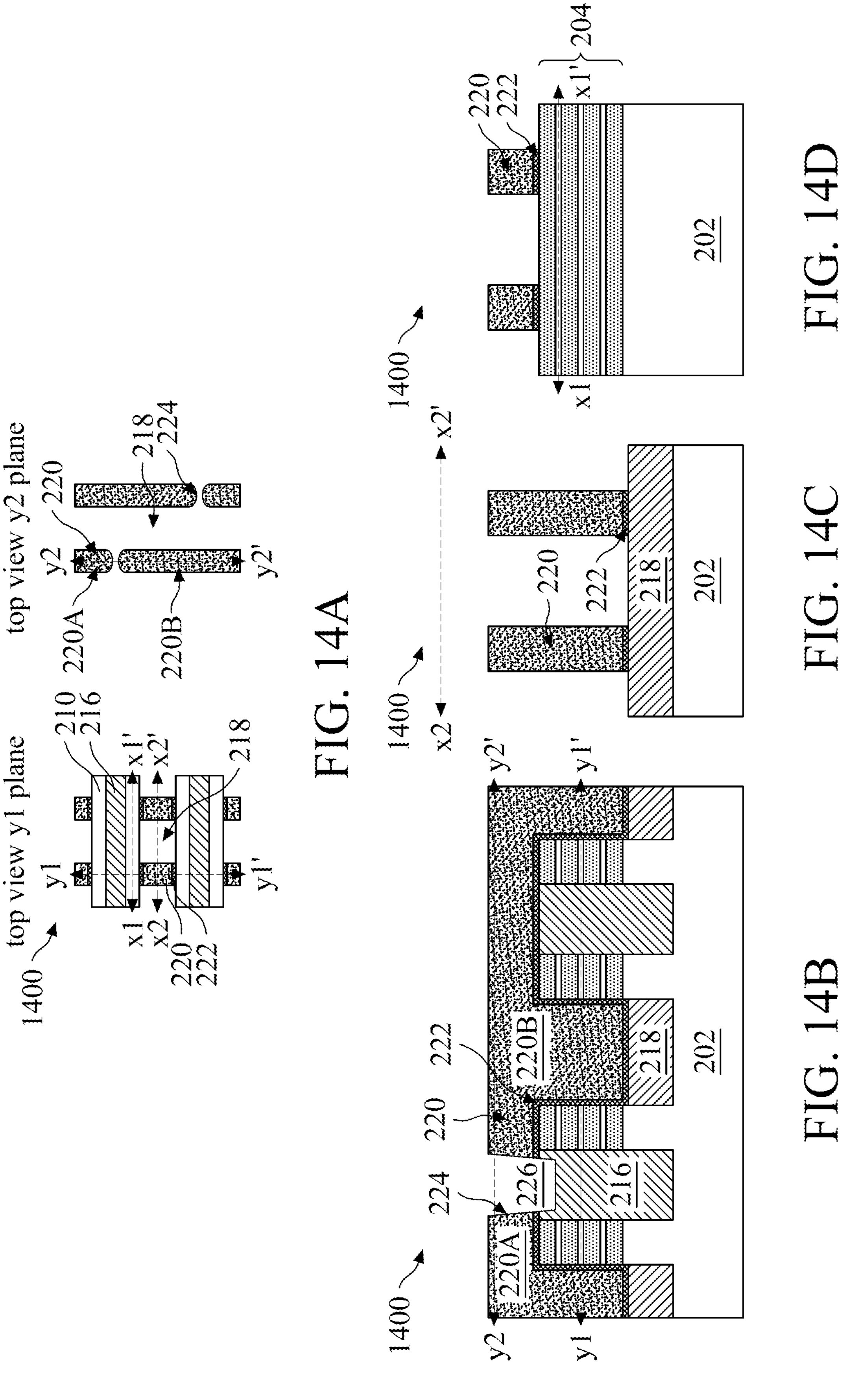

Referring now to FIGS. 13A and 13B, illustrated is a device 1300 substantially similar to the device 200 discussed above. Specifically, FIG. 13A of the device 1300 is substantially similar to the device 200 at a fabrication step illustrated FIG. 9A, except with an opening 1302 for forming a second gate isolation structure. In comparison with the device 200, the opening 902 has been extended to a rectangular shape to form the opening 1302; FIG. 13B of the device 1300 is substantially similar to the device 200 illustrated FIG. 10A with a difference of the gate isolation structure 1002 being extended to form isolation feature 1304. The device 1300 illustrates the opening 1302 extending such that it extends laterally into the adjacent contact etch stop layer (CESL) 806 and an interlayer dielectric (ILD) layer 808. In some instances, application of the opening 1302 and/or isolation feature 1304 is provided to ensure margin for the dummy gate electrode 220 to be completely removed.

Referring now to FIGS. 14A, 14B, 14C, and 14D through FIGS. 16A, 16B, 16C, and 16D, illustrated is an example of an alternative embodiment of the block 110 of the method 100 in forming a device 1400. The device 1400 is substantially similar to as discussed above with reference to the device 200 with differences noted here. In an embodiment of the block 110 of the method 100, an opening 226 in the dummy electrode 220 is patterned above the dielectric wall 216 substantially similar to as discussed above with reference to FIGS. 6A, 6B, 6C, 6D and as also shown in FIGS. 14A, 14B, 14C, and 14D with respect to device 1400. In an embodiment, block 110 then provides for the formation of the first gate isolation structure 1500 in the opening. In an embodiment, the first gate isolation structure 1500 is formed by depositing a dielectric material on the device 1400 filling the opening 226. Suitable dielectric materials for the isolation structure may include silicon oxide, silicon nitride, silicon oxycarbonitride, silicon carbonitride, silicon oxycarbide, silicon carbide, silicon oxynitride, aluminum oxide, $ZrSiO_4$, $HfSiO_4$, other high-k materials, combinations thereof, and/or other suitable dielectric materials. In an embodiment, the dielectric material of the first gate isolation structure 1500 is a high-k dielectric material. In an example process, the isolation material may be conformally deposited over the device 1400 using CVD, subatmospheric CVD (SACVD), ALD, or other suitable process. After deposition, a chemical mechanical planarization (CMP) and/or etching back process is performed that removes the isolation material from over the dummy electrode 220.

Figure 15A:
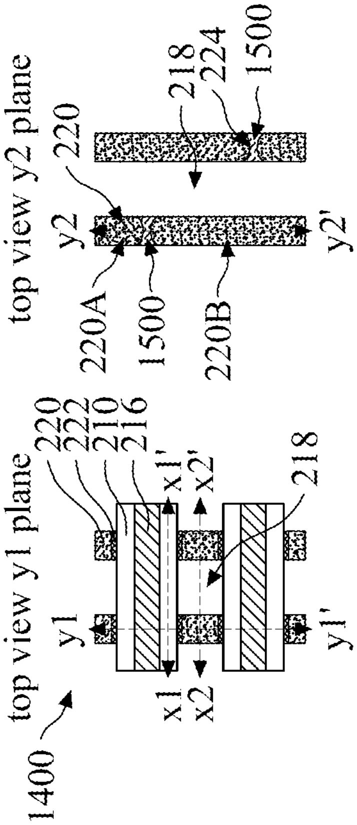
Figure 15B:
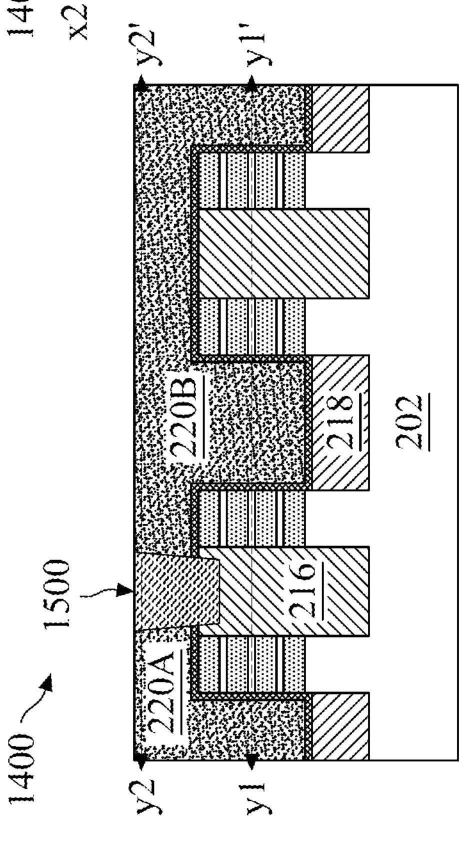
Figure 15C:
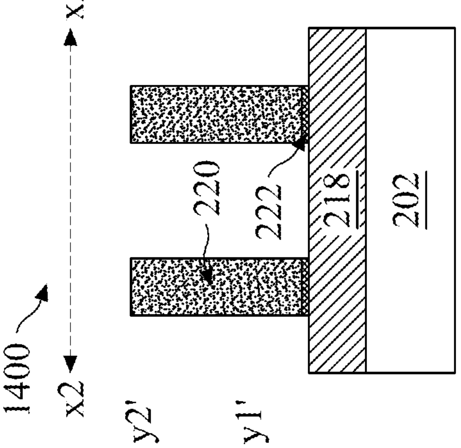
Figure 15D:
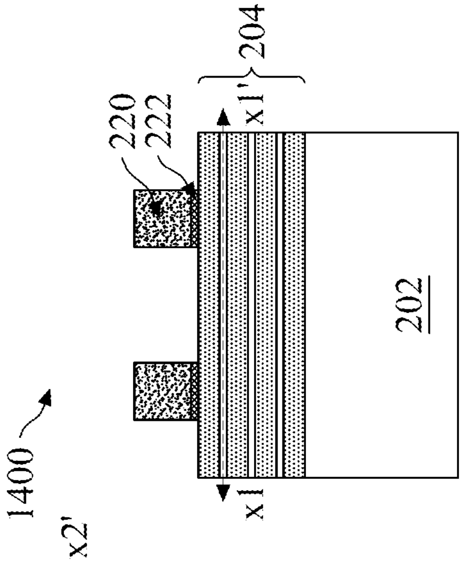
Figure 16A:
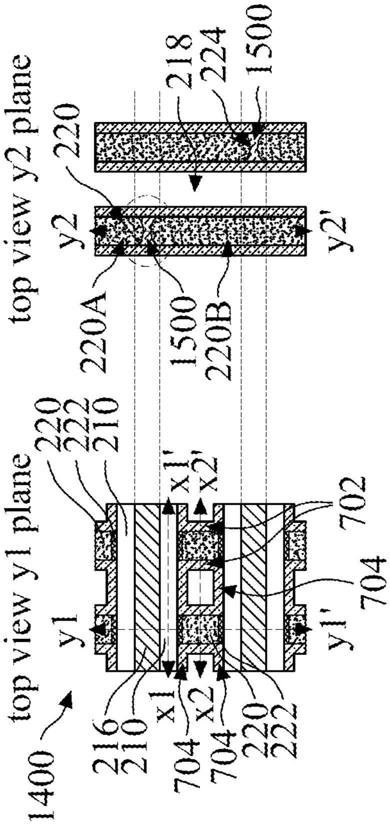
Figure 16B:
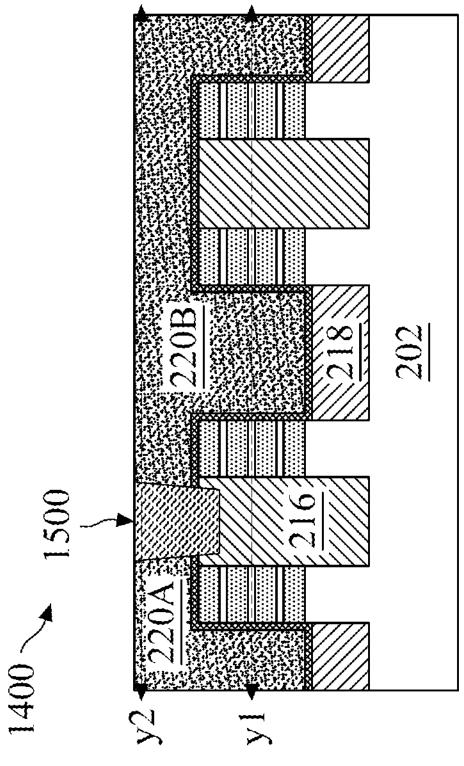
Figure 16C:
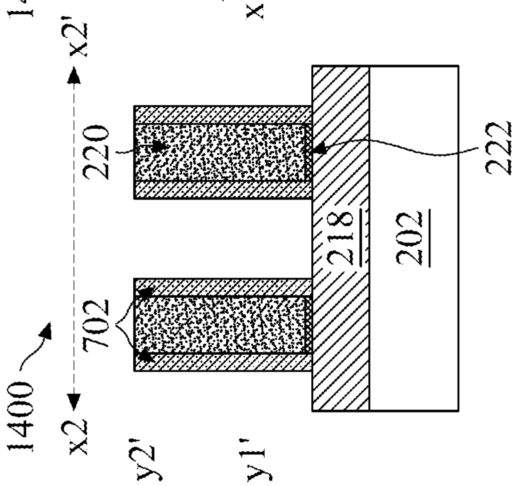
Figure 16D:
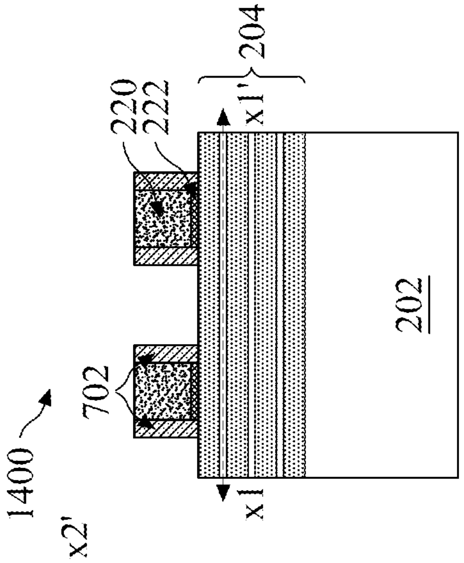

After formation of the first gate isolation structure 1500, the block 110 may continue to include forming gate spacers and/or fin spacers. FIGS. 16A, 16B, 16C, 16D illustrate the formation of spacers 702 and 704, which may be substantially similar to as discussed above with reference to FIGS. 7A, 7B, 7C, and 7D. It is noted that implementing the steps discussed with reference to FIGS. 14A-16D allows for the material of the first gate isolation structure 1500 to be different than the material of the spacers 702, 704. In some implementations, the material of the first isolation feature 1500 has a lower dielectric constant than the material(s) of the spacers 702, 704. In some implementations, the lower dielectric constant allows for improving parasitic capacitance of the device 1400. It is noted, as illustrated in FIGS. 15A and 16A, in some implementations there is no “notch” in the dielectric at the isolation feature 1500. Rather the spacers 702 include linear sidewalls including along the first gate isolation structure 1500.

Referring to another embodiment of the method 100, in some implementations of the method 100, block 116 occurs after block 120. That is, after the source/drain features are formed in block 112 and the CESL and/or ILD layer are formed in block 114, the method 100 proceeds to block 118 where the poly gate stack is removed and the channel layers are released and to block 120 where a gate structure is formed to wrap each of the channel members. Only after block 120, the implementation of the method 100 proceeds to block 116 where a second gate isolation feature is formed. In other words, the second gate isolation feature is a cut-metal gate (CMG) process as opposed to the cut-poly gate (CPO) process discussed above.

Figures 17A, 17B, 17C, 17D:
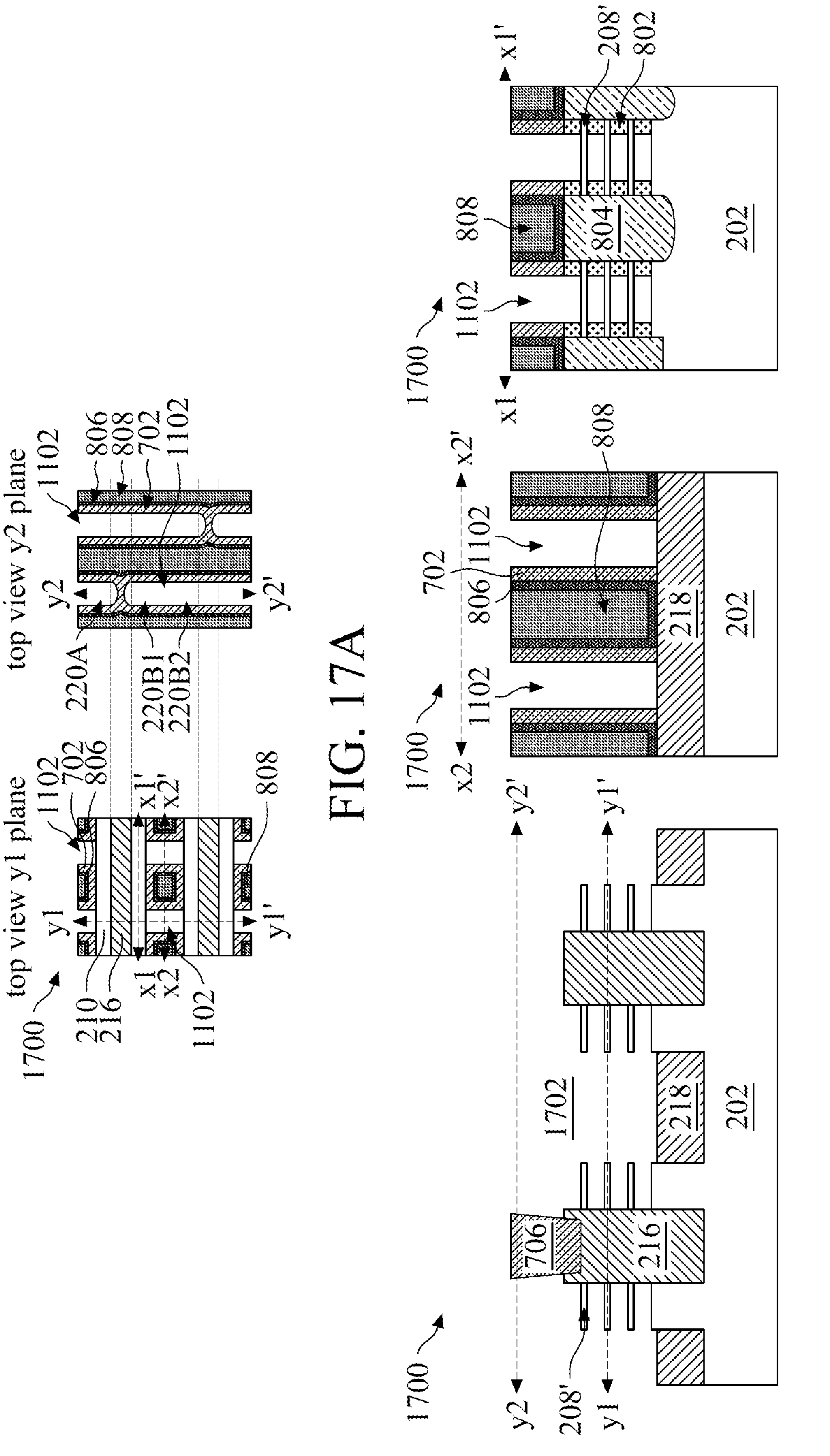
Figures 18A, 18B, 18C, 18D:
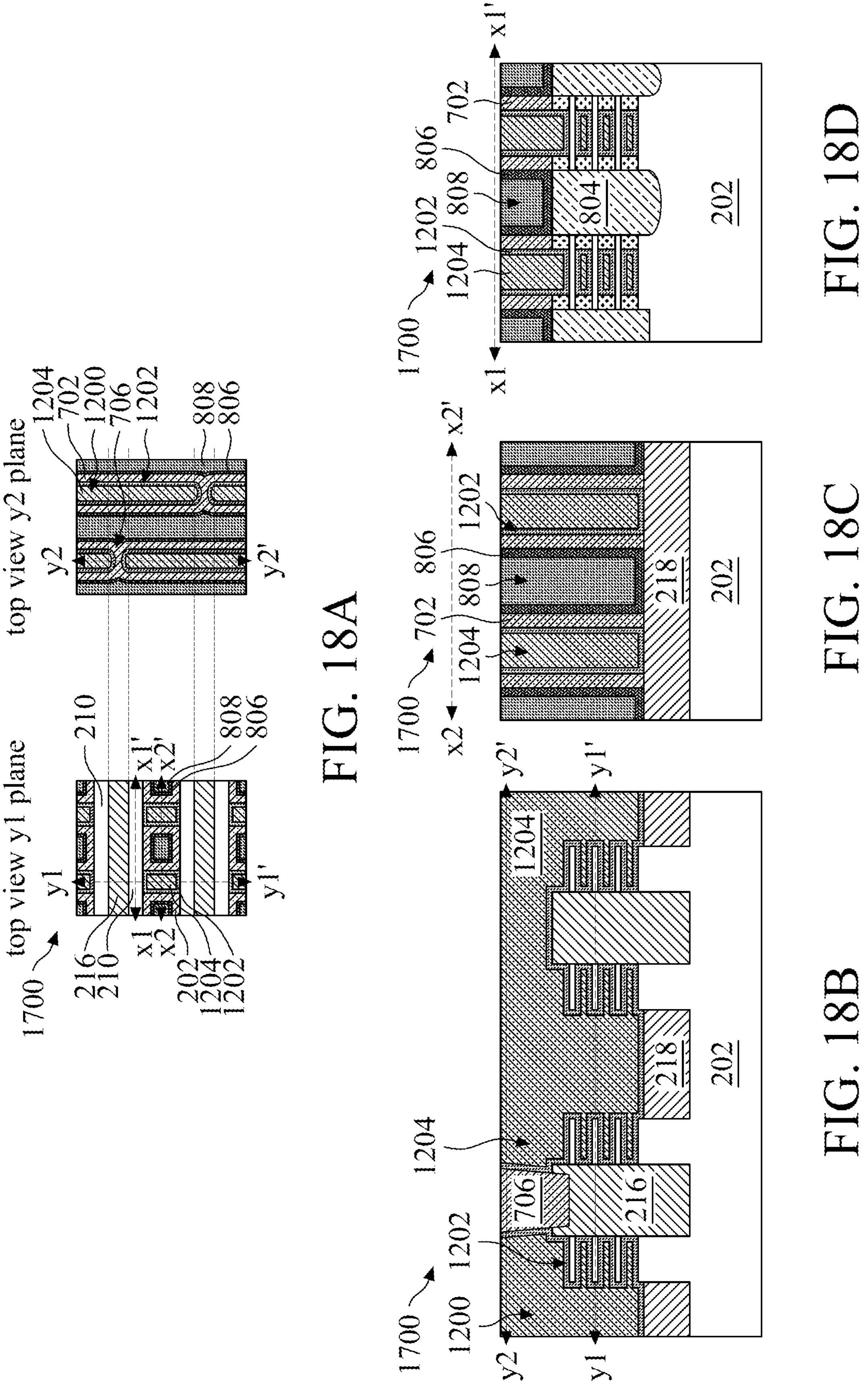
Figures 19A, 19B, 19C, 19D:
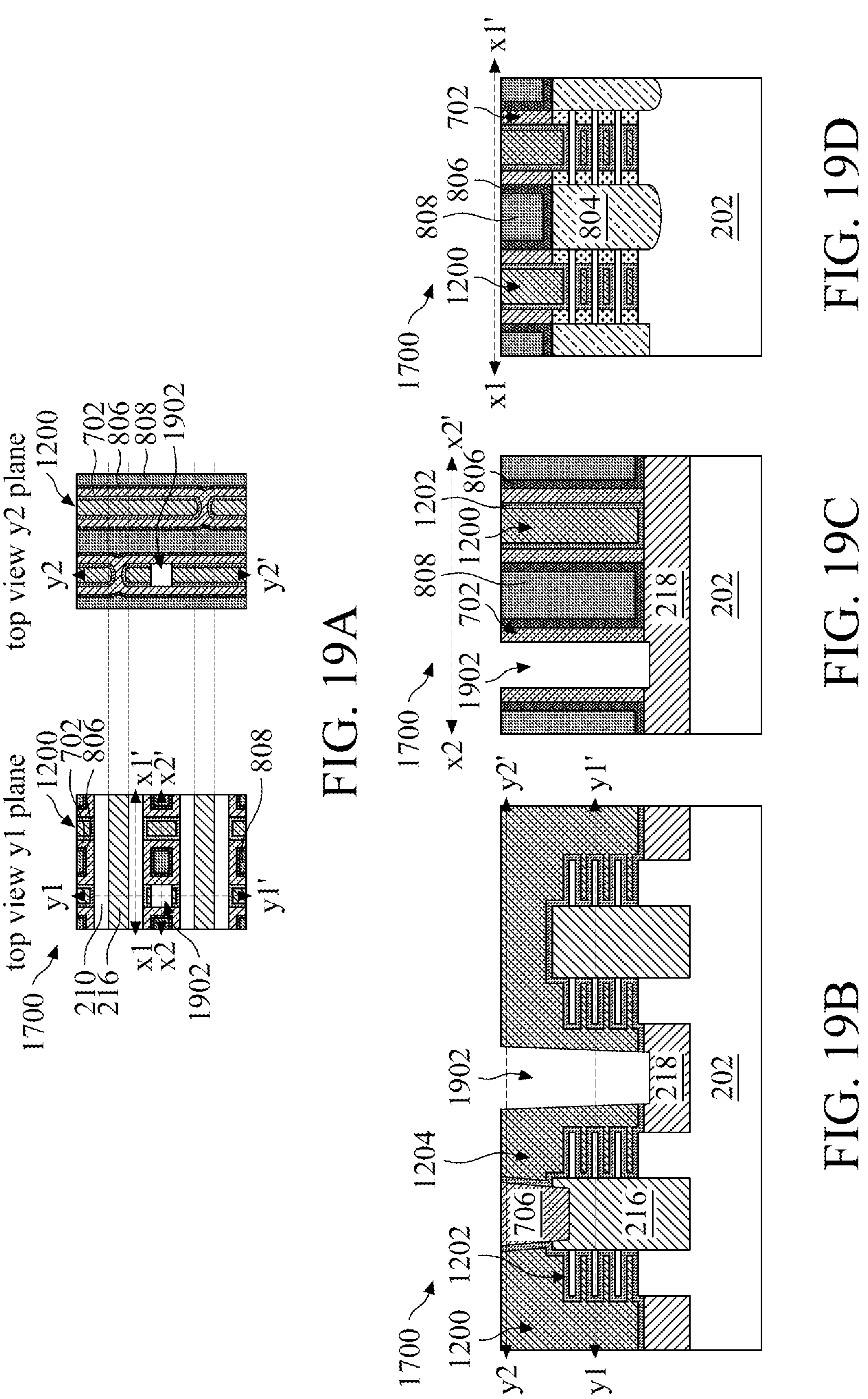

Using the exemplary device illustrated at FIGS. 8A, 8B, 8C, 8D as described above with reference to block 114, in an embodiment, the method 100 then proceeds to block 118 where the where the dummy gate stacks are removed and the channel layers in the channel regions of the fin-shaped structures are released to form the channel members. Referring to the example of FIGS. 17A, 17B, 17C, 17D and a device 1700, the channel layers 208 in the channel regions are released to form channel members 208' by removing the sacrificial layers 206. The dummy gate stack (dummy electrode 220 and/or dummy dielectric layer 222) are removed from the device 200 by a selective etch process to form a portion of the opening 1702. The selective etch process may be a selective wet etch process, a selective dry etch process, or a combination thereof. In the depicted embodiments, the selective etch process selectively removes the dummy dielectric layer 222 and the dummy electrode 220 without substantially etching the gate spacer 702. After the removal of the dummy gate stack, channel layers 208 and sacrificial layers 206, in the channel region are exposed. The exposed sacrificial layers 206 may be selectively removed to release the channel layers 208 to form channel members 208'. As shown in FIG. 17B, when viewed along the Y direction, the channel members 208' after being released have appearances of cantilever beams stemming from the dielectric wall 216. After their release, the channel members 208' are in contact with the dielectric wall 216. The selective removal of the sacrificial layers 206 may be implemented by selective dry etch, selective wet etch, or other selective etch processes. In some embodiments, the selective wet etching includes ammonium hydroxide ($NH_4OH$), hydrogen fluoride (HF), hydrogen peroxide ($H_2O_2$), or a combination thereof (e.g., an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$.

In an embodiment of the method 100, the method proceeds to block 120 where a gate structure is formed to wrap around each channel member released in block 118. Referring to the example of FIGS. 18A, 18B, 18C, 18D, a gate structure 1200 is formed to wrap around each of the channel members 208'. The gate structure 1200 may include a gate dielectric layer 1202 and a gate electrode layer 1204 over the gate dielectric layer 1202. In some embodiments, an interfacial layer is formed under the gate dielectric layer 1202 including on the channel members 208' and exposed substrate 202 as discussed above. The gate dielectric layer 1202 may include high-k dielectric materials such as hafnium oxide, titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

After the formation of the interfacial layer and the gate dielectric layer 1202, the gate electrode layer 1204 is deposited over the gate dielectric layer 1202. The gate electrode layer 1204 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 1204 may be formed by ALD, PVD, CVD, e-beam evaporation, or other suitable process.

In an embodiment of the method 100, the method then proceeds to block 116 forming the second gate isolation feature after the formation of the gate structure wrapping around each channel member released in block 118. Referring to the example of FIGS. 19A, 19B, 19C, and 19D, an opening 1902 is formed in gate structure 1200. The opening 1902 is formed by performing suitable photolithography and etching processes and extends to the isolation feature 218. In some implementations, the portion of the gate structure 1200 is removed in a dry etch process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the opening 1902 includes tapered sidewalls. In some implementations, the etching stops at a top surface of the isolation feature 218. In other embodiments, an over-etching is performed and an upper portion of the isolation feature 218 is removed within the opening 1902. It is noted that the opening 1902 has sidewalls formed of the gate electrode layer 1204 and gate dielectric layer 1202.

Figures 20A, 20B, 20C, 20D:
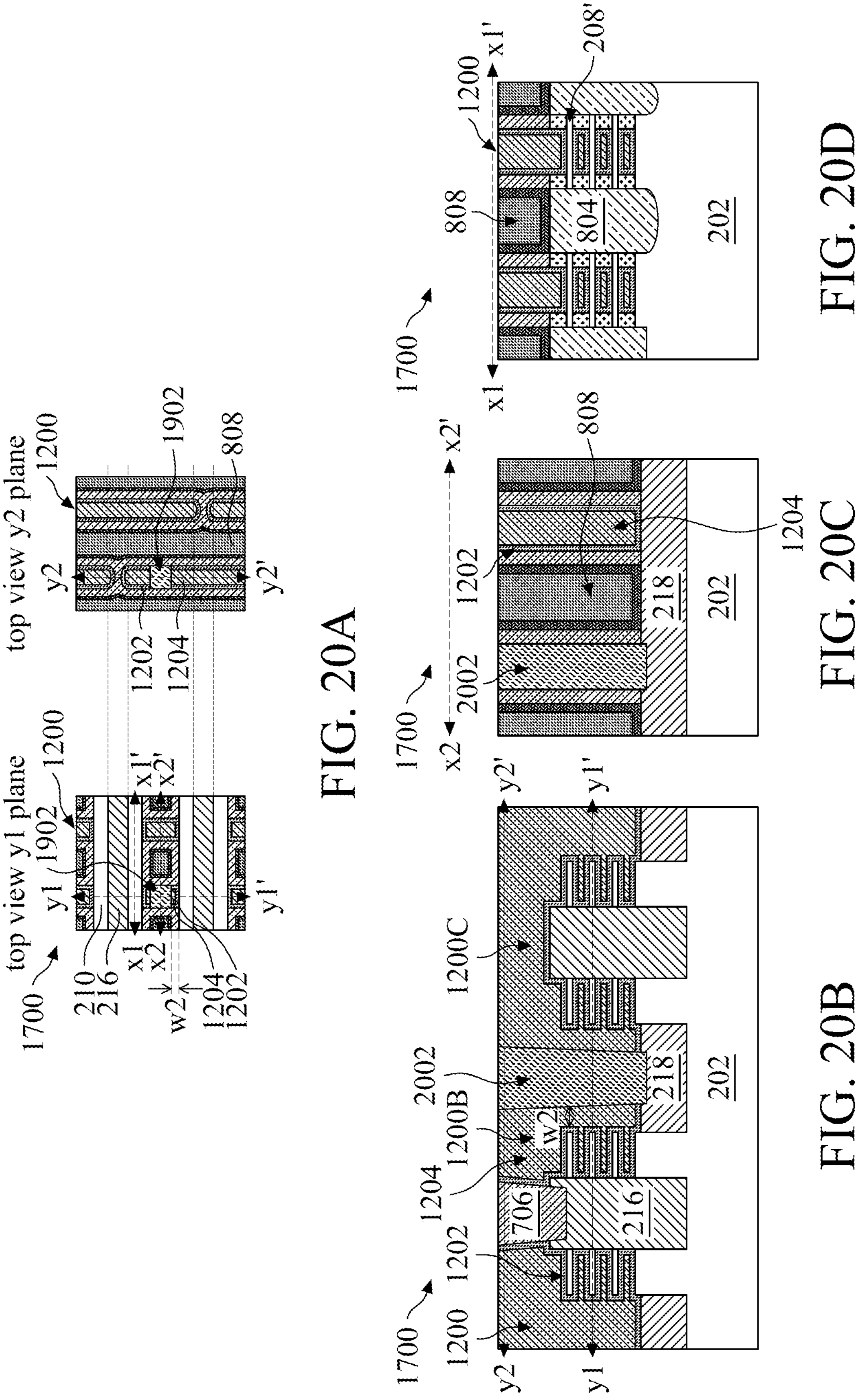

The opening 1902 is then filled with isolation material to form the second gate isolation structure 2002 as illustrated in FIGS. 20A, 20B, 20C, and 20D. The second gate isolation structure 2002 also isolates two portions (referred to as segments) of a gate structure 1200 from one another illustrated as gate segment 1200B and gate segment 1200C. Suitable dielectric materials for the second gate isolation structure 2002 may include silicon nitride, silicon oxycarbonitride, silicon carbonitride, silicon oxycarbide, silicon carbide, silicon oxynitride, aluminum oxide (AlO), zirconium silicate ($ZrSiO_4$), hafnium silicate ($HfSiO_4$), high-k dielectric materials, combinations thereof, and/or other suitable dielectric materials. In an example process, the isolation material may be conformally deposited over the device 1700 using CVD, SACVD, ALD, or other suitable process. After deposition, CMP and/or etching back processes are performed that remove the isolation material from the gate structure 1200 providing a planar top surface forming the second gate isolation structure 2002 as seen in FIGS. 20B, 20C.

In an embodiment, the second gate isolation structure 2002 provides an isolation between segments 1200B and 1200C of the gate structure 1200. In some implementations, the second gate isolation structure 2002 is substantially similar to the isolation feature 1002 discussed above. In some implementations, the formation of the second gate isolation structure 2002 as discussed herein includes benefits as a gate dielectric layer (such as layer 1202) is not formed extending along the sidewalls of second gate isolation structure 2002 (compare second gate isolation structure 1002 of FIG. 12B). Therefore, an enlarged spacing between the isolation feature at an end cap and/or reducing difficulty in remove dummy gate structures. See, e.g., increased relative dimension w2 of FIGS. 20A and 20B.

As discussed above with reference to the method 100 and block 110, in some implementations, the spacer formation is performed concurrently with forming the first gate isolation feature. In some embodiments, the opening 226 formed in the dummy gate stack (electrode 220, dielectric 222) defined by the poly end wall 224 as shown in the examples of FIGS. 6A, 6B, 6C, and 6D is substantially filled with dielectric material which also forms the spacers 702, 704. In some implementations of the method 100 and block 110 however, the dielectric material used to form the gate spacers and/or the fin spacers only fills the opening 226 only partially and an upper region of the opening 226 remains between the poly end wall 224. In such an embodiment, the remaining portion of the first gate separation structure is formed by the dielectric material or materials formed in block 114 filling the remaining portion of the opening 226.

Figure 21A:
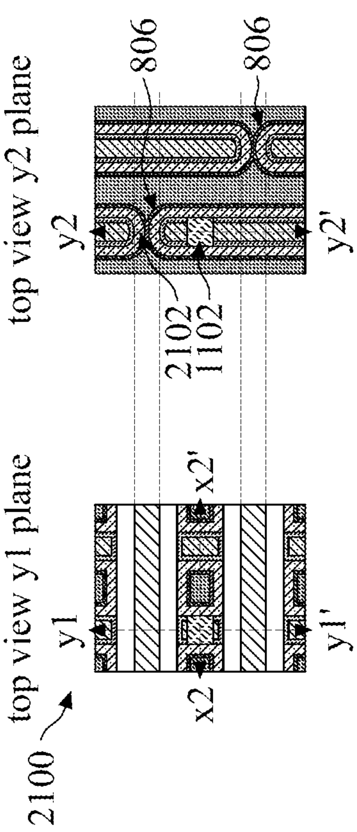
FIGS. 21A-21C illustrate fragmentary top views or cross-sectional views of a device having multiple regions of dielectric in a first gate isolation structure, according to one or more aspects of the present disclosure.
Figure 21B:
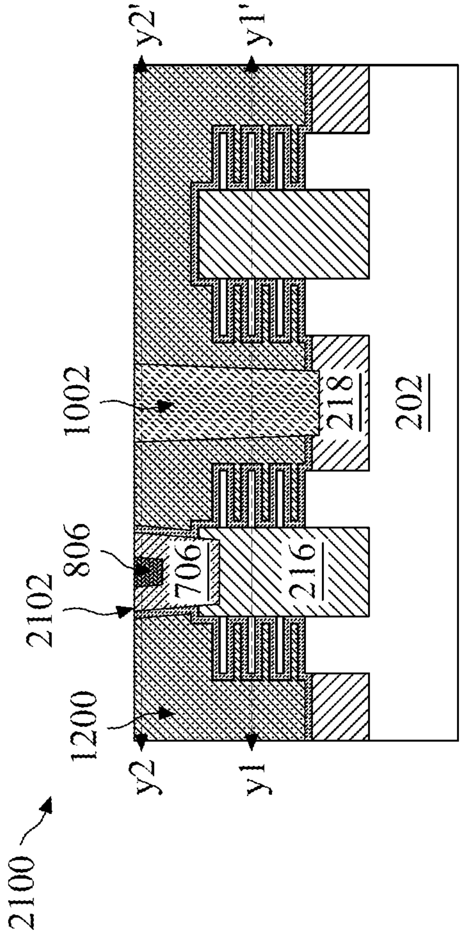
Figure 21C:
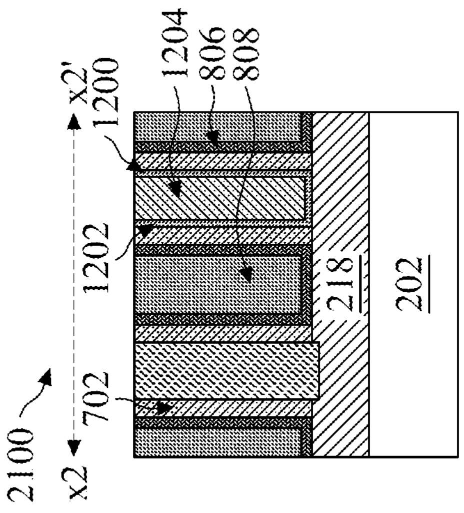

As illustrated by the example of FIGS. 21A, 21B, and 21C, in an embodiment exemplified by device 2100, a first gate isolation structure 2102 is formed over the dielectric wall 216. The first gate isolation structure 2102 includes a first region 706 and a second region 806. In an embodiment, the first region 706 includes a same material as and/or is formed concurrently with the spacers 702, 704. In an embodiment, the second region 806 is a portion of the material forming the CESL 806. The device 2100 may be fabricated by method 100 where in forming the spacers in block 110, only a portion (region 706) of the first gate isolation feature is formed. In block 114, a second portion (region 806) is formed.

Figure 22A:
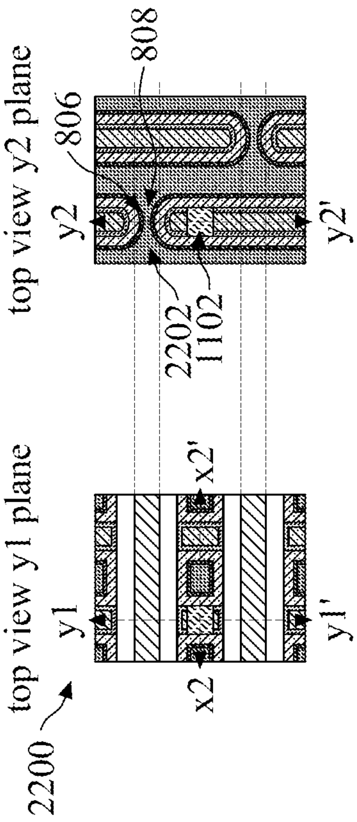
FIGS. 22A-22C illustrate fragmentary top views or cross-sectional views of another device having multiple regions of dielectric in a first gate isolation structure, according to one or more aspects of the present disclosure.
Figure 22B:
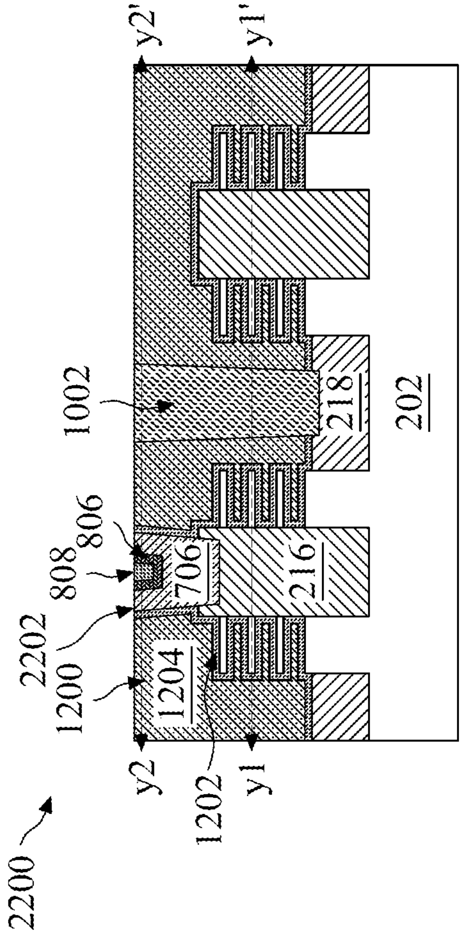
Figure 22C:
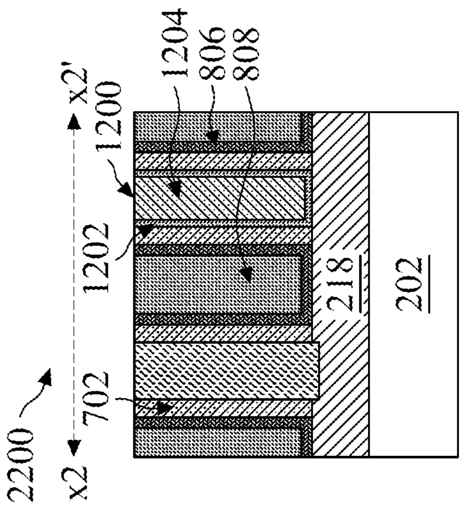

As illustrated by the example of FIGS. 22A, 22B, and 22C, in an embodiment exemplified by device 2200, a first gate isolation structure 2202 is formed over the dielectric wall 216. The first gate isolation structure 2202 includes a first region 706, a second region 806, and a third region 808. In an embodiment, the first region 706 includes a same material and/or is formed concurrently with the spacers 702, 704. In an embodiment, the second region 806 includes a same material and/or is formed concurrently with the CESL 806. In an embodiment, the second region 806 is a same material and/or is formed concurrently with the ILD layer 808. The device 2200 may be fabricated by method 100 where in forming the spacers in block 110, only a portion (region 706) of the first gate isolation feature is formed. In block 114, a second portion (region 806) is formed, which also does not entirely fill the opening between gate segments such that a third portion (region 808) is formed during a subsequent deposition of dielectric material (e.g., ILD).

Figure 23A:
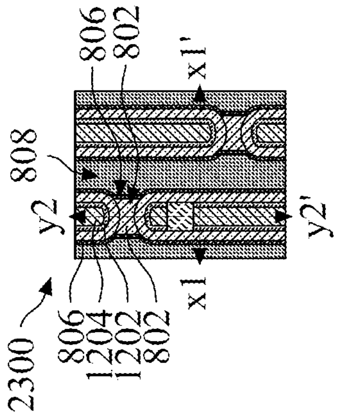
FIGS. 23A-23C illustrate fragmentary top views or cross-sectional views of another device having multiple regions of dielectric in a first gate isolation structure, according to one or more aspects of the present disclosure.
Figure 23B:
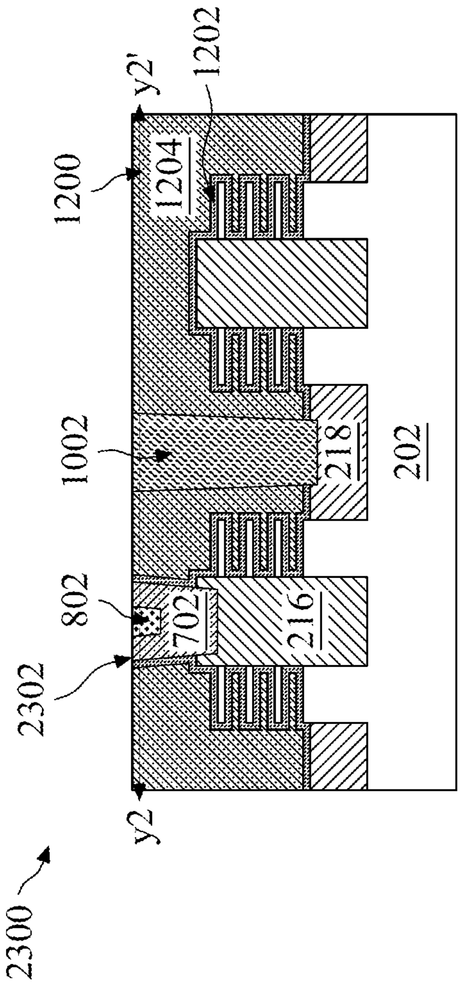
Figure 23C:
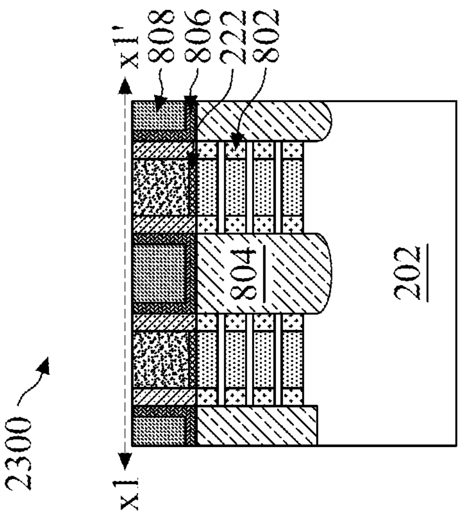

As illustrated by the example of FIGS. 23A, 23B, 23C in an embodiment exemplified by device 2300, a first gate isolation structure 2302 is formed over the dielectric wall 216. The first gate isolation structure 2302 includes a first region 706 and a second region 802. In an embodiment, the first region 706 includes a same material and/or is formed concurrently with the gate spacers 702 and/or the fin spacers 704. In an embodiment, the second region 802 is formed with the same material as and/or concurrently with the inner spacer 802. The device 2300 may be fabricated by method 100 where in forming the spacers in block 110, only a portion (region 706) of the first gate isolation structure 2302 is formed. The remaining of the opening 226 over the dielectric wall 216 is filled with dielectric material when forming the inner spacer 802. Further in some embodiments as discussed above, the opening 226 as shown in the examples of FIGS. 6A, 6B, 6C, and 6D is substantially filled with a separate dielectric material as discussed above with reference to FIGS. 14A-16D. Any of the above described embodiments may be combined.

Thus, provided are devices and/or method that form gate isolation structures. The methods and devices may allow for two types of gate isolation structures to be formed on different structures, e.g., one gate isolation structure on a dielectric wall, and one gate isolation structure on a STI. In some implementations, this forms gate isolation structures having a different depth and/or distance from a top surface of a substrate. In some implementations, one gate isolation structure (such as 702) is formed adjacent a dummy gate end and thus may be referred to as a poly gate natural end structure. In some implementations, one gate isolation structure (such as 1102) is formed by cutting a gate structure and thus may be referred to as a cut-poly (CPO) or cut-metal gate (CMG) structure. Methods are provided that in some implementations allow for a reduction in the photolithography, etching and deposition steps used to form the gate isolation structures. For example, the first gate isolation structure may be formed concurrently with the patterning of the gate structure and/or subsequent dielectric depositions (e.g., spacers, CESL, ILD).

In one aspect of the present disclosure, a method is provided that includes forming a stack over a substrate, the stack comprising a plurality of channel layers interleaved by a plurality of sacrificial layers. The stack and a portion of the substrate are patterned to form a first fin-shaped structure, a second fin-shaped structure, and a third fin-shaped structure. A dielectric fin is formed between the first fin-shaped structure and the second fin-shaped structure. A shallow trench isolation (STI) is provided between the second fin-shaped structure and the third fin-shaped structure. A first segment of a gate stack is provided over a channel region of the first fin-shaped structure, a second segment of the gate stack over a channel region of each of the second fin-shaped structure and the third fin-shaped structure, and a first opening extending between the first segment and the second segment and overlying the dielectric fin. The method continues to fill the first opening with at least a first dielectric material to form a first isolation structure. And a region of the second segment of the gate stack is removed to form a second opening, which is filled with a second dielectric material.

In an embodiment of the method, removing the region of the second segment of the gate stack includes patterning the second opening in a metal gate structure. In an implementation, the removing the region of the second segment of the gate stack includes patterning the second opening in a dummy gate structure. In an embodiment, filling the first opening with at least the first dielectric material includes forming gate spacers of the first dielectric material on sidewalls of the first segment and the second segment of the gate stack concurrently with filling a first portion of the first opening with the first dielectric material. In a further embodiment, the first opening is filled with at least the first dielectric material that further includes forming a contact etch stop layer (CESL) in the first opening. After filling the first opening to form the first isolation structure and prior to removing the region of the second segment of the gate stack to form the second opening, a source/drain feature may be epitaxially grown.

In some implementations, the channel layers are released to form nanostructures that extend outward from the dielectric fin. In some implementations, the channel layers are disposed on different sides of the dielectric fin and extend horizontally as opposed to the vertical extension of the dielectric fin. In some embodiments, removing the region of the second segment of the gate stack to form the second opening exposes a surface of the STI, and the second dielectric material is formed on the surface of the STI.

In another of the broader embodiments of the disclosure, a semiconductor structure is provided that includes a dielectric fin extending in a first direction, a first plurality of nanostructures extending from a first sidewall of the dielectric fin and a second plurality of nanostructures extending from a second sidewall of the dielectric fin. The second sidewall opposes the first sidewall. A third plurality of nanostructures are spaced a distance from the second plurality of nanostructures. A shallow trench isolation (STI) is between the second plurality of nanostructures and the third plurality of nanostructures. A first gate segment is disposed over and between the first plurality of nanostructures, a second gate segment is disposed over and between the second plurality of nanostructures, and a third gate segment is disposed over and between the third plurality of nanostructures. Each of the first, second and third gate segments extend in a second direction, perpendicular to the first direction. A first gate isolation feature is provided between the first gate segment and the second gate segment, and the first gate isolation feature extends to interface an upper surface the dielectric fin. A second gate isolation feature is between the second gate segment and the third gate segment and the second gate isolation feature extends to interface an upper surface of the STI. In a top view the first gate isolation feature has a first length measured at a center line of the first gate segment and a second length at a line collinear with an edge of the first gate segment. The second length is at least about 1.2 times the first length.

In an embodiment, the first length and the second length are measured from a gate dielectric layer of the first gate segment to a gate dielectric layer of the second gate segment. And in an embodiment, the first gate isolation feature interfaces a gate dielectric layer of the first gate segment and a gate dielectric layer of the second gate segment, while the second gate isolation feature may interface a gate electrode layer of the second gate segment. In an embodiment, a dielectric material of the first gate isolation feature is different than a dielectric material of the second gate isolation feature. In some implementations, a dielectric material of the first gate isolation feature is a same composition as a dielectric material forming spacers on sidewalls of each of the first, second and third gate segments. In an embodiment, the first gate isolation feature includes a first region of a first dielectric composition, a second region of a second dielectric composition, and a third region of a third dielectric composition.

In another of the broader disclosures, a semiconductor structure includes a first plurality of nanostructures adjacent a first sidewall of a dielectric fin and a second plurality of nanostructures adjacent a second sidewall of the dielectric fin. The second sidewall opposes the first sidewall. A first gate segment is disposed over and between the first plurality of nanostructures and a second gate segment is disposed over and between the second plurality of nanostructures. A first gate isolation feature is disposed between the first gate segment and the second gate segment and on the dielectric fin. And a second gate isolation feature disposed on a shallow trench isolation (STI) had spaced a distance from the second plurality of nanostructures. The first gate isolation feature has a different composition than the second gate isolation feature.

In an embodiment, the first gate isolation feature includes a first composition and the gate spacers abutting sidewalls of the first gate segment and the second gate segment also comprise the first composition. In a further embodiment, the first gate isolation feature also further includes a second composition. And a contact etch stop layer is formed adjacent the gate spacers has the second composition.

In an embodiment, the first gate isolation feature includes a first composition of a high dielectric constant material. In some implementations of the device, the second gate isolation feature has a direct interface with a gate electrode of the second gate segment. In an embodiment, the first gate isolation feature has a bow-tie shape in a top view. The bow-tie shape has a first width in a center portion and a second width at a first edge and a second edge, the second width greater than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a dielectric fin extending in a first direction in a top view;

a first stack of a plurality of nanostructures disposed adjacent a first sidewall of the dielectric fin, wherein the first stack of the plurality of nanostructures includes a first channel layer and a second channel layer disposed over and spaced a vertical distance from the first channel layer in a cross-sectional view;

a second stack of a plurality of nanostructures disposed adjacent a second sidewall of the dielectric fin, the second sidewall opposing the first sidewall, wherein the second stack of the plurality of nanostructures includes a third channel layer and a fourth channel layer disposed over and spaced a vertical distance from the third channel layer in the cross-sectional view;

a third stack of a plurality of nanostructure channel layers spaced a lateral distance from the second stack of the plurality of nanostructures in the cross-sectional view, wherein a shallow trench isolation (STI) is between the second stack of the plurality of nanostructures and the third stack of the plurality of nanostructure channel layers;

a first gate segment disposed over and between the first channel layer and the second channel layer of the first stack of the plurality of nanostructures, a second gate segment disposed over and between the third channel layer and the fourth channel layer of the second stack of the plurality of nanostructures, and a third gate segment disposed over and between channel layers of the third stack of the plurality of nanostructure channel layers, wherein each of the first, second and third gate segments extend in a second direction in the top view and are collinear in the second direction, the second direction perpendicular to the first direction in the top view;

a first gate isolation feature between the first gate segment and the second gate segment, wherein the first gate isolation feature extends to interface an upper surface of the dielectric fin;

a second gate isolation feature between the second gate segment and the third gate segment, wherein the second gate isolation feature extends to interface an upper surface of the STI; and wherein in the top view the first gate isolation feature has a first length measured at a center line of the first gate segment and a second length at a line collinear with an edge of the first gate segment, wherein the second length is at least about 1.2 times the first length.

2. The semiconductor structure of claim 1, wherein the first length and the second length are measured from a gate dielectric layer of the first gate segment to a gate dielectric layer of the second gate segment.

3. The semiconductor structure of claim 1, wherein the first gate isolation feature interfaces a gate dielectric layer of the first gate segment and a gate dielectric layer of the second gate segment, and wherein the second gate isolation feature interfaces a gate electrode layer of the second gate segment.

4. The semiconductor structure of claim 1, wherein a dielectric material of the first gate isolation feature is different than a dielectric material of the second gate isolation feature.

5. The semiconductor structure of claim 1, wherein a dielectric material of the first gate isolation feature is a same composition as a dielectric material forming spacers on sidewalls of each of the first, second and third gate segments.

6. The semiconductor structure of claim 1, wherein the first gate isolation feature includes a first region of a first dielectric composition, a second region of a second dielectric composition, and a third region of a third dielectric composition.

7. A semiconductor structure, comprising:

a dielectric fin extending vertically above a substrate and extending substantially horizontally in a top view;

a first plurality of vertically stacked nanostructures and a second plurality of vertically stacked nanostructures in a first cross-sectional view, the first plurality and the second plurality of vertically stacked nanostructure extending substantially horizontally in a top view, the dielectric fin disposed between the first plurality of nanostructures and the second plurality of nanostructures;

a first gate segment disposed over and between the first plurality of nanostructures; a second gate segment disposed over and between the second plurality of nanostructures;

a first gate isolation feature disposed between the first gate segment and the second gate segment and on the dielectric fin, wherein the first gate isolation feature has a first sidewall having an interface with the first gate segment and the first plurality of nanostructures and has a second sidewall having an interface with the second gate segment and the second plurality of nanostructures in a cross-sectional view; and a second gate isolation feature disposed on a shallow trench isolation (STI) spaced a distance from the second plurality of nanostructures, wherein the first gate isolation feature has a different composition than the second gate isolation feature.

8. The semiconductor structure of claim 7, wherein the first gate isolation feature includes a first composition and wherein gate spacers abutting sidewalls of the first gate segment and the second gate segment comprise the first composition.

9. The semiconductor structure of claim 8, wherein the first gate isolation feature further includes a second composition, wherein a contact etch stop layer formed adjacent the gate spacers has the second composition.

10. The semiconductor structure of claim 7, wherein the first gate isolation feature includes a first composition of a high dielectric constant material.

11. The semiconductor structure of claim 7, wherein the second gate isolation feature has a direct interface with a gate electrode of the second gate segment.

12. The semiconductor structure of claim 7, wherein the first gate isolation feature has a bow-tie shape in a top view, wherein the bow-tie shape has a first width in a center portion and a second width at a first edge and a second edge, the second width greater than the first width.

* * * * *